(12) United States Patent
Han

(10) Patent No.: US 7,232,712 B2
(45) Date of Patent: Jun. 19, 2007

(54) CMOS IMAGE SENSOR AND METHOD FOR FABRICATING THE SAME

(75) Inventor: Chang Hun Han, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/975,200

(22) Filed: Oct. 28, 2004

(65) Prior Publication Data

US 2005/0088556 A1 Apr. 28, 2005

(30) Foreign Application Priority Data

Oct. 28, 2003 (KR) ............... 10-2003-0075417
Oct. 28, 2003 (KR) ............... 10-2003-0075424
Dec. 31, 2003 (KR) ............... 10-2003-0101547

(51) Int. Cl.
*H01L 21/339* (2006.01)

(52) U.S. Cl. ................ 438/144; 257/215

(58) Field of Classification Search ........... 257/215, 257/218, 220, 233, 291, 292, E27.133, E27.148, 257/E27.149, E27.15; 438/60, 144, 75, 76
See application file for complete search history.

(56) References Cited

U.S. PATENT DOCUMENTS

| | | | |
|---|---|---|---|
| 5,841,126 A | 11/1998 | Fossum et al. | |
| 5,886,659 A | 3/1999 | Pain et al. | |
| 5,990,506 A | 11/1999 | Fossum et al. | |
| 6,005,619 A | 12/1999 | Fossum | |
| 6,021,172 A | 2/2000 | Fossum et al. | |
| 6,979,587 B2 * | 12/2005 | Lee ........................... | 438/57 |
| 7,005,689 B2 * | 2/2006 | Song et al. ................ | 257/290 |

* cited by examiner

*Primary Examiner*—David Vu
(74) *Attorney, Agent, or Firm*—Andrew D. Fortney

(57) ABSTRACT

A CMOS image sensor and a method for fabricating the same is disclosed, to decrease a darkcurrent generated in the boundary between a diffusion area of a photodiode and a device isolation layer, which includes a first conductive type semiconductor substrate having an active area and a device isolation area, the active area including a photodiode and a transistor; a device isolation layer formed in the device isolation area of the semiconductor substrate; a second conductive type diffusion area formed in the photodiode of the semiconductor substrate at a predetermined interval from the device isolation layer; a gate insulating layer and a gate electrode formed in the transistor of the semiconductor substrate; and a first conductive type first diffusion area formed in the semiconductor substrate of the boundary between the second conductive type diffusion area and the device isolation layer.

15 Claims, 22 Drawing Sheets

$$\tan\theta = \frac{W}{H_1 + H_2}$$

$$\tan\theta = \frac{W}{H_1 + H_2}$$

CMOS IMAGE SENSOR AND METHOD FOR FABRICATING THE SAME

This application claims the benefit of the Korean Application Nos. P2003-75424 filed on Oct. 28, 2003, P2003-75417 filed on Oct. 28, 2003, and P2003-101547 filed on Dec. 31, 2003, which are hereby incorporated by reference.

BACKGROUND OF THE INVENTION

1. Field of the Invention

The present invention relates to a CMOS image sensor, and more particularly, to a CMOS image sensor and a method for fabricating the same, to decrease a darkcurrent generated in the boundary between a diffusion area of a photodiode and a device isolation layer.

2. Discussion of the Related Art

Generally, an image sensor is a semiconductor device for converting an optical image into an electric signal. The image sensor can be broadly categorized into a charge coupled device (CCD) and a complementary metal oxide semiconductor (CMOS) image sensor.

The charge coupled device (CCD) includes a plurality of photodiodes (PD) aligned in a matrix-type configuration and converting light signals into electric signals, a plurality of vertical charge coupled devices (VCCD) formed between each vertical photodiode aligned in a matrix-type configuration and vertically transmitting electric charges generated from each photodiode, a horizontal charge coupled device (HCCD) for horizontally transmitting the electric charges transmitted by each of the vertical charge coupled devices (VCCD), and a sense amplifier (Sense Amp) for sensing and outputting the horizontally transmitted electric charges.

However, the charge coupled device (CCD) has disadvantages of a complicated driving method, high power consumption, and a complicated fabrication process requiring a multi-phased photo process. In the charge coupled device (CCD), a control circuit, a signal processing circuit, an analog to digital (A/D) converter circuit, and so on cannot be easily integrated into a charge coupled device chip, thereby having the problem of forming compact-size products.

Recently, the complementary metal oxide semiconductor (CMOS) image sensor has been considered to be the next generation image sensor that can resolve the problems and disadvantages of the charge coupled device (CCD). The CMOS image sensor is a device adopting a CMOS technology using the control circuit, the signal processing circuit, and so on as a peripheral circuit, so as to form MOS transistors in correspondence with the number of unit pixels on a semiconductor substrate, in order to sequentially detect the electric signals of each unit pixel by using a switching method, thereby representing an image.

Since the CMOS image sensor uses a CMOS fabrication technology, the CMOS image sensor is advantageous in that it has low power consumption and has a simple fabrication method through less photo process steps. In the CMOS image sensor, a control circuit, a signal processing circuit, an A/D converter circuit, and so on can be integrated into a CMOS image sensor chip, thereby enabling the product to be fabricated in a compact size. Accordingly, the CMOS image sensor is currently and extensively used in various applied technologies, such as digital still cameras and digital video cameras.

Meanwhile, the CMOS image sensor is categorized into a 3T-type, a 4T-type, and a 5T-type according to the number of transistors, wherein the 3T-type CMOS image sensor is comprised of one photodiode and three transistors, and the 4T-type CMOS image sensor is comprised of one photodiode and four transistors. A layout of a unit pixel in the 4T-type CMOS image sensor will be described as follows.

FIG. 1 is an equivalent circuit view of a 4T-type CMOS image sensor according to the related art. FIG. 2 is a layout of a unit pixel of a 4T-type CMOS image sensor according to the related art. FIG. 3 is a cross sectional view of a photodiode and a transfer gate along I–I' of FIG. 2.

As shown in FIG. 1, the unit pixel 100 of the CMOS image sensor includes a photodiode 110 of a photoelectric conversion part, and four transistors. The four transistors are respectively formed of a transfer transistor 120, a reset transistor 130, a drive transistor 140, and a select transistor 150. Also, a load transistor 160 is electrically connected to an output terminal OUT of the unit pixel 100. At this time, non-explained reference FD is a floating diffusion area, Tx is a gate voltage of the transfer transistor 120, Rx is a gate voltage of the reset transistor 130, Dx is a gate voltage of the drive transistor 140, and Sx is a gate voltage of the select transistor 150.

In the unit pixel of the general 4T-type CMOS image sensor, as shown in FIG. 2, an active area 15 (heavy line) is defined, and a device isolation layer is formed in the portion except the active area 15. Then, one photodiode PD is formed in a large sized portion of the active area 15, and gate electrodes 123, 133, 143, 153 of the four transistors are formed to be overlapped with the remaining portion of the active area 15. That is, the transfer transistor 120 is formed by the gate electrode 123, the reset transistor 130 is formed by the gate electrode 133, the drive transistor 140 is formed by the gate electrode 143, and the select transistor 150 is formed by the gate electrode 153. Herein, impurity ions are implanted to the active area 15 of the respective transistors except the gate electrodes 123, 133, 143, 153, thereby forming source/drain regions S/D of the respective transistors.

Specifically, the photodiode and the transfer transistor of the aforementioned CMOS image sensor according to the related art will be described as follows.

Referring to FIG. 3, a $P^-$ type epitaxial layer 11 is formed on a $P^{++}$ type semiconductor substrate 10. Then, as shown in FIG. 2, so as to define the active area 15, the device isolation layer 13 is formed on a device isolation area of the semiconductor substrate 10. After that, a gate insulating layer 121 and a gate 123 are formed on the epitaxial layer 11 for the transfer transistor 120, and sidewall insulating layers 125 are formed at both sidewalls of the gate 123. Also, an $n^-$ type diffusion area 131 and a $P^\circ$ type diffusion area 132 are formed in the epitaxial layer 11 of the photodiode PD. The $P^\circ$ type diffusion area 132 is formed on the $n^-$ type diffusion area 131. In addition, the source/drain regions S/D are formed of a highly doped n-type diffusion area $N^+$ and a lightly doped n-type diffusion area $n^-$.

However, the related art CMOS image sensor having the aforementioned structure has the problems of low device efficiency and low charge storing capacity due to the increase of a darkcurrent. That is, the darkcurrent is generated due to the electrons moving from the photodiode PD to a neighboring area in state of that the light is not incident on the photodiode PD. Generally, the darkcurrent is caused by various defects and dangling bond in the surface of the semiconductor substrate, in the boundary between the device isolation layer and the $P^\circ$ type diffusion area, in the boundary between the device isolation layer and the $n^-$ type diffusion area, in the boundary between the $P^\circ$ type diffusion area and the $n^-$ type diffusion area. Under the circumstance of low illumination, the darkcurrent may generate the serious problems such as low device efficiency and low charge storing capacity in the CMOS image sensor.

Accordingly, the P° type diffusion area is formed in the surface of the photodiode so as to decrease the darkcurrent, especially, the darkcurrent generated in a surface of a silicon substrate, in the related art CMOS image sensor.

However, the related art CMOS image sensor is much effected by the darkcurrent generated in the boundary between the device isolation layer 13 and the P° type diffusion area of the photodiode PD, and in the boundary between the device isolation layer 13 and the n⁻ type diffusion area of the photodiode PD.

In more detail, as shown in FIG. 3, when forming a photoresist layer pattern (not shown), serving as an ion implantation mask layer for the n⁻ type diffusion area 131 and the P° type diffusion area 132 of the photodiode PD, on the semiconductor substrate 10, the active area for the photodiode PD is exposed in an opening of the photoresist layer pattern. In this state, the impurity ions for the n⁻ type diffusion area 131 and the P° type diffusion area 132 are implanted to the active area of the photodiode PD, the impurity ions for the n⁻ type diffusion area 131 and the P° type diffusion area 132 are also implanted to the boundary between the active area of the photodiode PD and the device isolation layer 13.

Accordingly, the related art CMOS image sensor may have the damage due to the impurity implantation in the boundary between the n⁻ type diffusion area and the P° type diffusion area and the device isolation layer, and furthermore, may have the defect. This defect causes the generation of electron and hole carrier, also, provides the recombination of the electron. As a result, a leakage current of the photodiode PD increases, whereby the darkcurrent of the CMOS image sensor increases.

As described above, the related art CMOS image sensor has the following disadvantages.

In the related art CMOS image sensor, when implanting the impurity ions to form the diffusion area of the photodiode PD, the impurity ions are implanted to the boundary between the device isolation layer and the active area of the photodiode PD. As a result, it is difficult to prevent the increase of the darkcurrent generated in the boundary between the device isolation layer and the active area for the photodiode PD, so that it has the limitation to the decrease of the darkcurrent.

SUMMARY OF THE INVENTION

Accordingly, the present invention is directed to a CMOS image sensor and a method for fabricating the same that substantially obviates one or more problems due to limitations and disadvantages of the related art.

An object of the present invention is to provide a CMOS image sensor and a method for fabricating the same, to decrease a darkcurrent by forming a diffusion area for preventing a leakage current in the boundary between a device isolation layer and a photodiode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a first conductive type semiconductor substrate having an active area and a device isolation area, the active area including a photodiode and a transistor; a device isolation layer formed in the device isolation area of the semiconductor substrate; a second conductive type diffusion area formed in the photodiode of the semiconductor substrate at a predetermined interval from the device isolation layer; a gate insulating layer and a gate electrode formed in the transistor of the semiconductor substrate; and a first conductive type first diffusion area formed in the semiconductor substrate of the boundary between the second conductive type diffusion area and the device isolation layer.

Furthermore, the CMOS image sensor includes a passivation layer on the semiconductor substrate of the boundary between the device isolation layer and the photodiode.

At this time, the passivation layer is formed of an oxide layer or a nitride layer.

Also, a sidewall insulating layer is formed at the side of the gate electrode, and the passivation layer is formed of the same material as the sidewall insulating layer.

Also, the passivation layer is formed in a deposition structure of the gate insulating layer and the gate electrode of the transistor.

In addition, the first conductive type first diffusion area is formed below the passivation layer.

Also, the first conductive type first diffusion area is formed deeper than the second conductive type diffusion area.

Also, the first conductive type semiconductor substrate has a first conductive type epitaxial layer.

Furthermore, the CMOS image sensor includes a first conductive type second diffusion area in the surface of the second conductive type diffusion area of the photodiode.

At this time, the first conductive type first diffusion area has impurity ions of a higher concentration than that of impurity ions of the first conductive type second diffusion area.

Also, the device isolation layer has a higher surface than that of the semiconductor substrate.

In addition, the CMOS image sensor includes an ion implantation prevention layer at the side of the device isolation layer having the higher surface than that of the semiconductor substrate.

Also, the first conductive type first diffusion area is formed below the ion implantation prevention layer.

In another aspect, a method for fabricating a CMOS image sensor includes the steps of forming a device isolation layer in a device isolation area of a first conductive type semiconductor substrate, so as to define an active area having a photodiode and a transistor; forming a gate insulating layer, a gate electrode, and a sidewall insulating layer in the transistor, and forming a passivation layer on the semiconductor substrate of the boundary between the device isolation layer and the photodiode; forming a second conductive type diffusion area in the photodiode of the active area; and forming a first conductive type first diffusion area in the semiconductor substrate of the boundary between the second conductive type diffusion area and the device isolation layer.

At this time, the first conductive type first diffusion area is formed by tilt-implanting first conductive type impurity ions with the passivation layer.

Also, the first conductive type first diffusion area is formed deeper than the second conductive type diffusion area.

Furthermore, the method includes the step of forming a first conductive type second diffusion area in the surface of the second conductive type diffusion area of the photodiode.

At this time, the first conductive type first diffusion area has impurity ions of a higher concentration than that of impurity ions of the first conductive type second diffusion area.

Also, the first conductive type second diffusion area is formed at a predetermined interval from the gate electrode.

Also, the passivation layer is formed of the same material as the sidewall insulating layer.

Also, the passivation layer is formed in a deposition structure of the gate insulating layer and the gate electrode of the transistor.

In another aspect, a method for fabricating a CMOS image sensor includes the steps of forming a projected device isolation layer having a higher surface than that of a first conductive type semiconductor substrate, in a device isolation area, so as to define an active area having a photodiode and a transistor; forming an ion implantation prevention layer at the sidewall of the projected device isolation layer; forming a gate insulating layer and a gate electrode in the transistor; forming a second conductive type diffusion area in the photodiode of the active area; and forming a first conductive type first diffusion area in the semiconductor substrate of the boundary between the second conductive type diffusion area and the device isolation layer.

At this time, the process of forming the device isolation layer includes the steps of forming oxidizing insulating layer on the semiconductor substrate; selectively removing the oxidizing insulating layer so as to expose the semiconductor substrate of the device isolation area; forming a trench by etching the exposed semiconductor substrate; depositing an insulating layer to fill the trench, and planarizing the insulating layer to expose the surface of the oxidizing insulating layer; and removing the oxidizing insulating layer.

In addition, the method includes the step of forming a thermal oxide layer on an inner surface of the trench after forming the trench.

At this time, the ion implantation prevention layer is formed of a nitride layer.

Accordingly, a $P^+$ type diffusion area is formed between the device isolation layer and the diffusion area for the photodiode, so that it is possible to decrease the darkcurrent generated between the device isolation layer and the diffusion area for the photodiode. As a result, it is possible to decrease the darkcurrent of the CMOS image sensor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for fabricating the same will be described with reference to the accompanying drawings.

Figure 1:
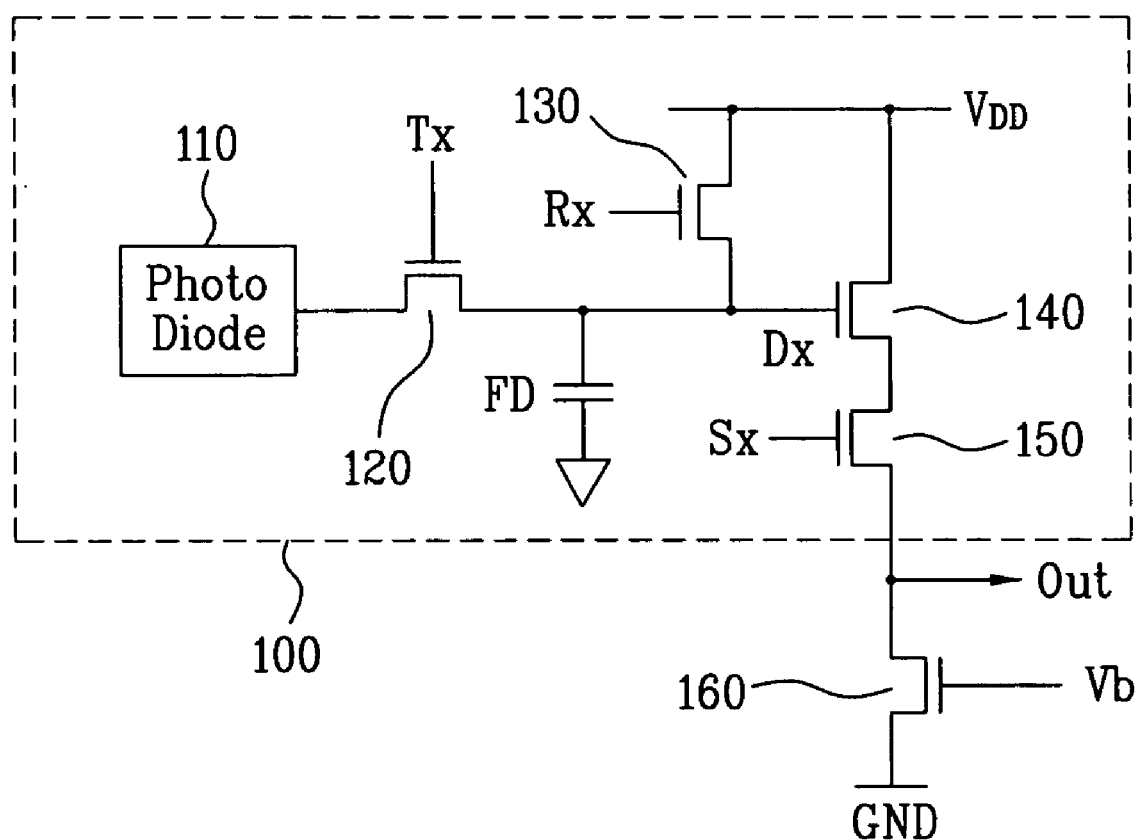
FIG. 1 is an equivalent circuit view of a unit pixel of a CMOS image sensor according to the related art.
Figure 2:
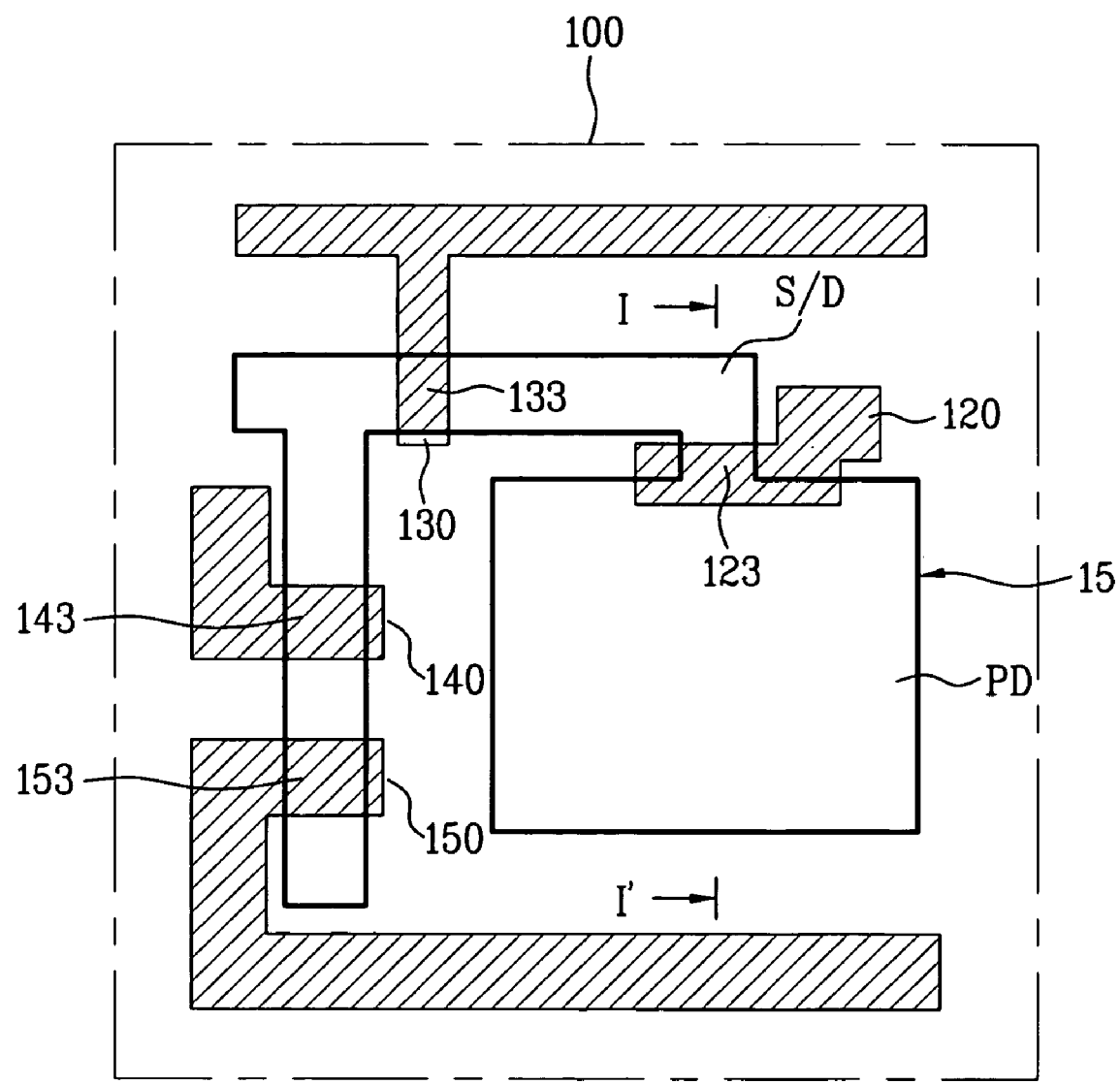
FIG. 2 is a layout of a unit pixel of a CMOS image sensor according to the related art.
Figure 3:
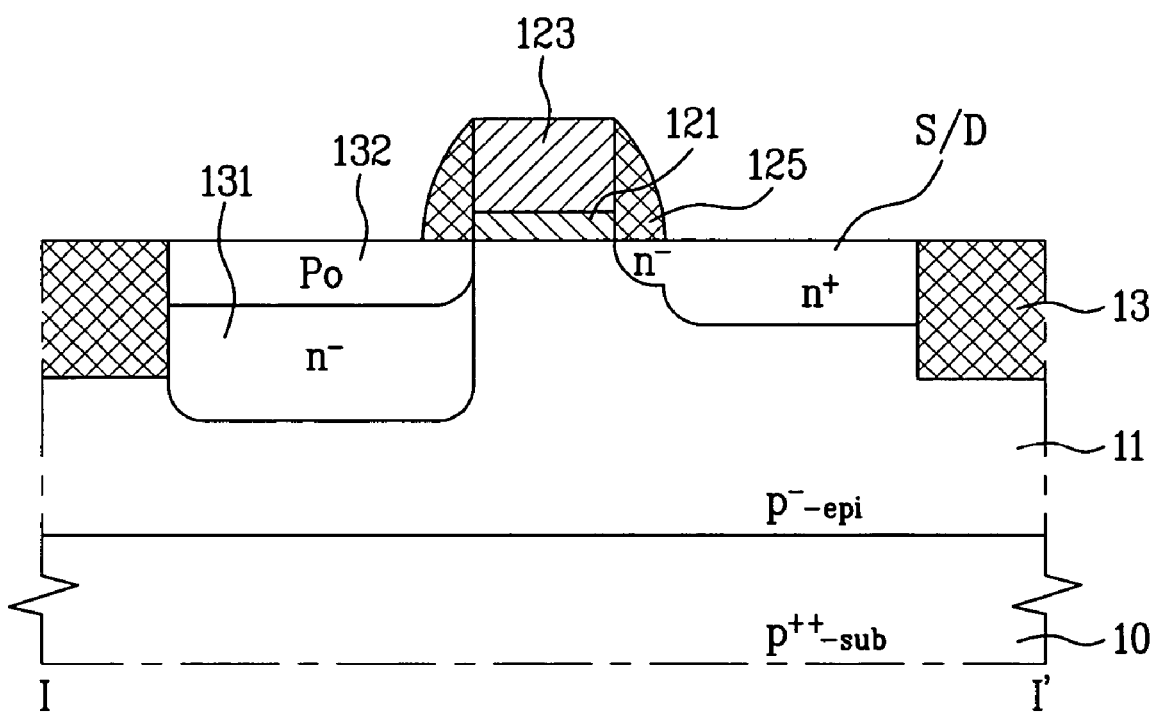
FIG. 3 is a cross sectional view of a photodiode along I–I' of FIG. 2.
Figure 4:
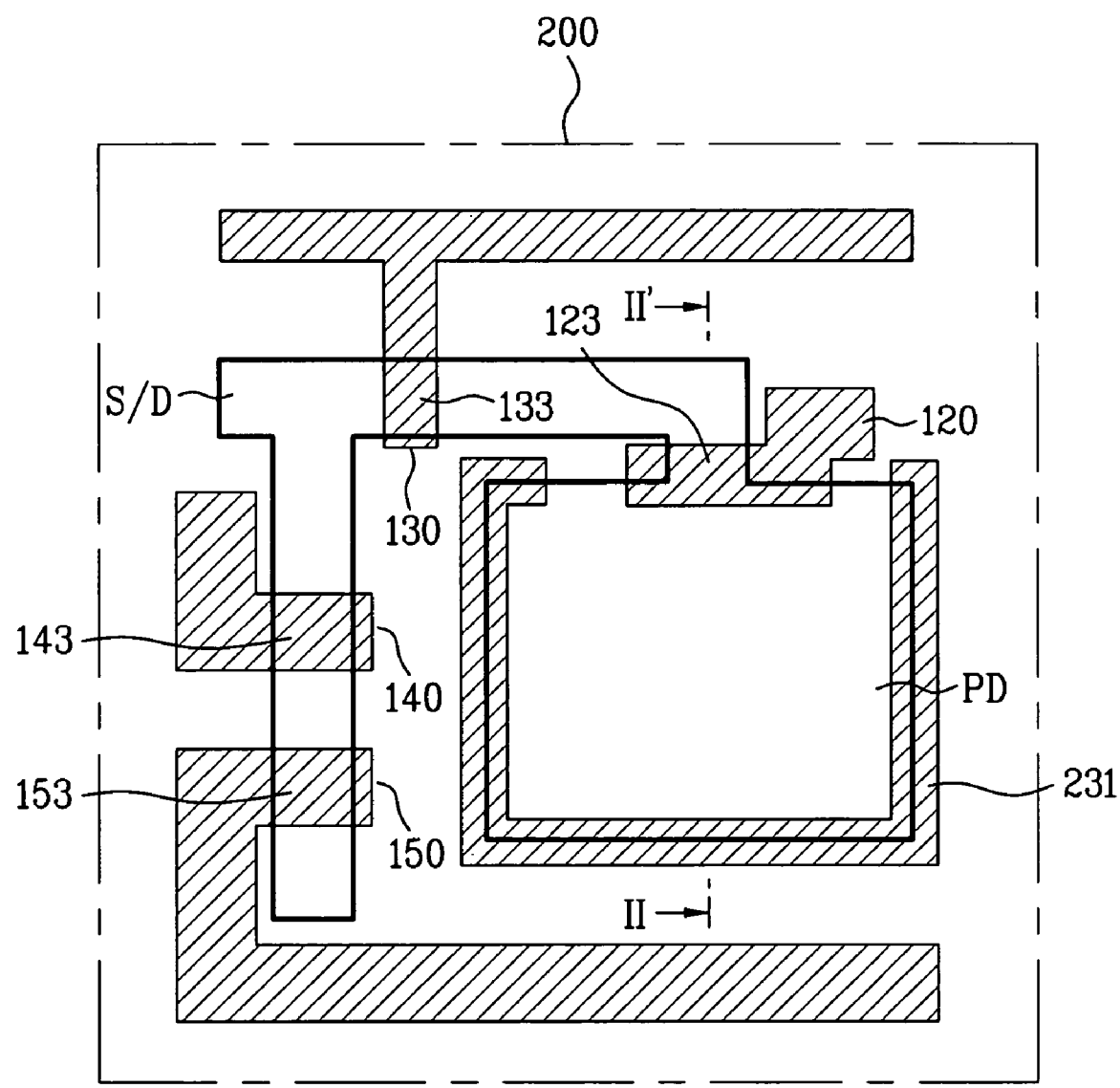
FIG. 4 is a layout of a unit pixel of a CMOS image sensor according to the present invention.

FIG. 4 is a layout of a unit pixel of a CMOS image sensor according to the present invention.

In the unit pixel 200 of the CMOS image sensor according to the present invention, as shown in FIG. 4, an active area 15 (heavy line) is defined, and a device isolation layer is formed in the portion except the active area 15. Then, one photodiode PD is formed in a large sized portion of the active area 15, and gate electrodes 123, 133, 143, 153 of four transistors are formed to be overlapped with the remaining portion of the active area 15. That is, the transfer transistor 120 is formed by the gate electrode 123, the reset transistor 130 is formed by the gate electrode 133, the drive transistor 140 is formed by the gate electrode 143, and the select transistor 150 is formed by the gate electrode 153. Herein, impurity ions are implanted to the active area 15 of the respective transistors except the portions corresponding to the gate electrodes 123, 133, 143, 153, so as to form source/drain regions S/D of the respective transistors.

Also, a passivation layer 231 is provided in the periphery of the active area 15 for the photodiode PD, so as to protect the photodiode PD from the implantation of the impurity ions. The passivation layer 231 is formed along the boundary between the active area 15 for the photodiode PD and the device isolation layer.

Meanwhile, the accompanying drawings show that the unit pixel 200 of the CMOS image sensor according to the present invention includes one photodiode and four transistor. However, it is possible to provide one photodiode and three transistors, that is, the reset transistor, the drive transistor and the select transistor. Hereinafter, for the convenience of explanation, the unit pixel of the CMOS image sensor having one photodiode and four transistors will be described as follows.

Figure 5:
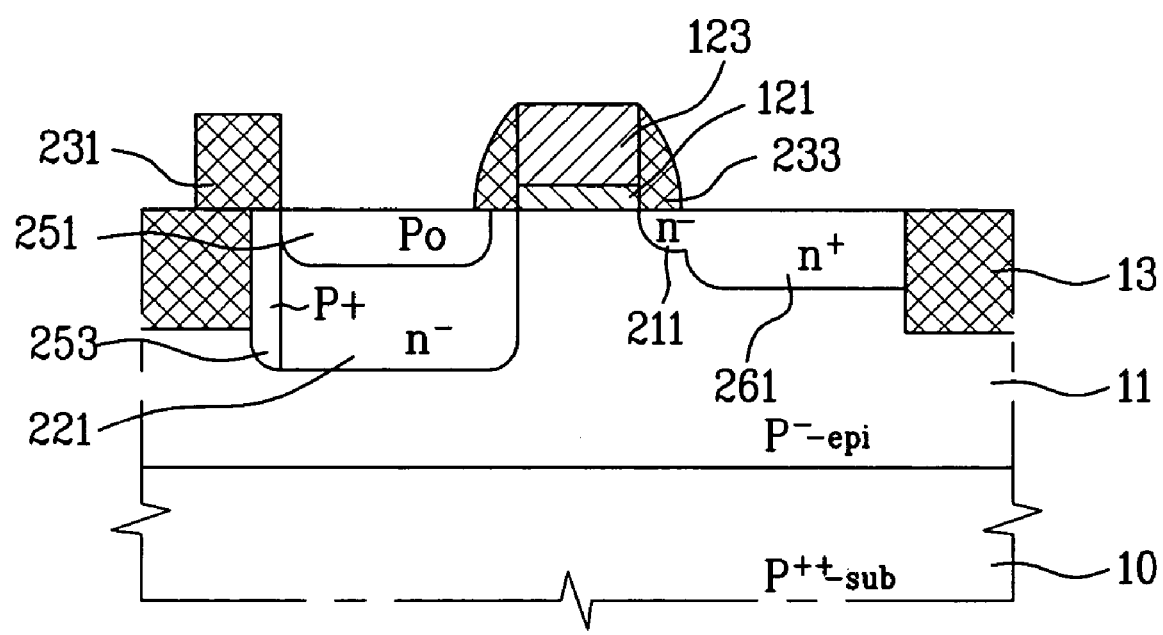
FIG. 5 is a cross sectional view of a photodiode along II–II' of FIG. 4 according to the first embodiment of the present invention.

FIG. 5 is a cross sectional view of the photodiode along II–II' of FIG. 4 according to the first embodiment of the present invention.

In the CMOS image sensor according to the first embodiment of the present invention, as shown in FIG. 5, a $P^-$ type epitaxial layer 11 is formed on a $P^{++}$ type semiconductor substrate 10. The semiconductor substrate 10 may be formed of a crystal silicon substrate. To define and active area, a device isolation layer 13 is formed in a device isolation area of the semiconductor substrate 10. The device isolation layer 13 is formed in an STI (shallow trench isolation) process or an LOCOS (local oxidation of silicon) process. In this structure, a gate insulating layer 121 and a gate 123 are formed on the active area of the epitaxial layer 11 for the transfer transistor 140 of FIG. 4. Then, insulating layers 233 are formed at both sidewalls of the gate 123.

After that, an $n^-$ type diffusion area 221 and a $P^\circ$ type diffusion area 251 are formed in the epitaxial layer 11 of a photodiode PD. The $P^\circ$ type diffusion area 251 is formed on the $n^-$ type diffusion area 221, and the $P^\circ$ type diffusion area 251 is formed at a predetermined interval from the gate electrode 123. Also, source/drain regions S/D are formed of a highly doped n-type diffusion area $N^+$ 261 and a lightly doped n-type diffusion area $n^-$ 211. Then, a passivation layer 231 is formed along the boundary between the photodiode PD and the device isolation layer 13, and a $P^+$ type diffusion area 253 is formed below the passivation layer 231 in the boundary between the photodiode PD and the device isolation layer 13. The $P^+$ type diffusion area 253 is formed in the epitaxial layer 11 between the $n^-$ type diffusion area 221/$P^\circ$ type diffusion area 251 and the device isolation layer 13. Herein, the $P^+$ type diffusion area 253 has the same depth as the $n^-$ type diffusion area 221. Or, the $P^+$ type diffusion area 253 may be deeper than the $n^-$ type diffusion area 221.

Meanwhile, as shown in the drawings, the photodiode PD has the $n^-$ type diffusion area 221 and the $P^\circ$ type diffusion area 251. However, it is possible to provide the photodiode PD having the only $n^-$ type diffusion area 221. At this time, $P^{++}$ type and $P^+$ type mean the highly doped P type, $P^\circ$ type means the medium doped P type, and $P^-$ type means the lightly doped P type. Also, $n^+$ type means the highly doped n-type, and $n^-$ type means the lightly doped n-type.

In case of the CMOS image sensor according to the first embodiment of the present invention, the $n^-$ type diffusion area 221 and the $P^\circ$ type diffusion area 251 comprising the photodiode PD are positioned apart from the device isolation layer 13 by the $P^+$ type diffusion area 253, whereby it is possible to decrease a darkcurrent generated in the boundary between the $n^-$ type diffusion area 221/$P^\circ$ type diffusion area 251 and the device isolation layer 13. That is, the pair of electron and hole generated in the boundary between the device isolation layer 13 and the photodiode PD is recombined in the $P^+$ type diffusion area 253, thereby decreasing the darkcurrent generated in the boundary.

Also, if the $P^\circ$ type diffusion area 251 is formed in the portion below the gate electrode 123, a barrier potential is formed below the gate electrode 123 at the side of the photodiode PD. Thus, it may cause the degradation of charge transfer efficiency for transferring the charges gathered on the photodiode PD to the source/drain regions. However, in the CMOS image sensor according to the first embodiment of the present invention, the $P^\circ$ type diffusion area 251 is positioned at the predetermined interval from the gate electrode 123, so that it is possible to improve the charge transfer efficiency.

A method for fabricating the CMOS image sensor according to the first embodiment of the present invention will be described as follows. FIG. 6A to FIG. 6I are cross sectional views for the fabrication process of the CMOS image sensor along II–II' of FIG. 4 according to the first embodiment of the present invention.

Figure 6A:
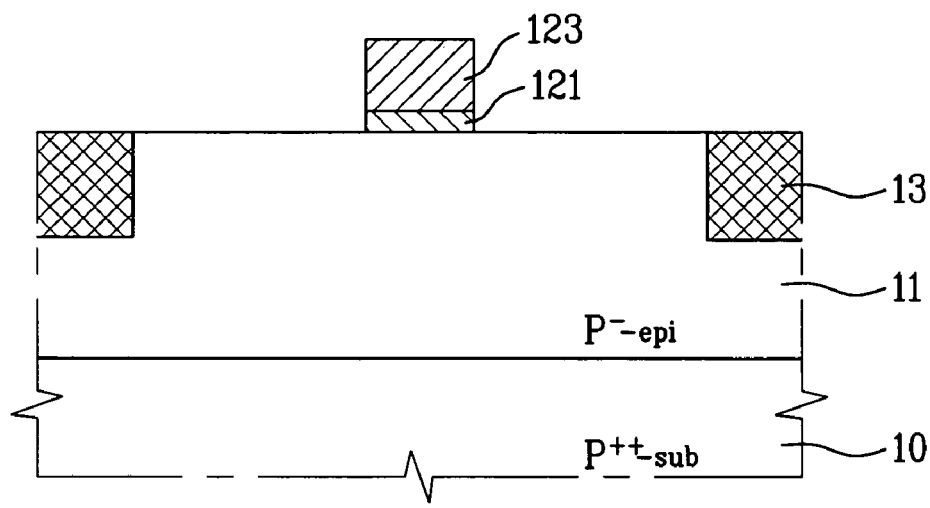
FIG. 6A to FIG. 6I are cross sectional views for the fabrication process of a CMOS image sensor along II–II' of FIG. 4 according to the first embodiment of the present invention.

As shown in FIG. 6A, the lightly doped first conductive type ($P^-$ type) epitaxial layer 11 is formed on the semiconductor substrate 10 of a highly doped first conductive type ($P^{++}$ type) crystal silicon material by an epitaxial process. The epitaxial layer 11 has a large and deep depletion region in the photodiode PD, so as to improve the capacity of the low-voltage photodiode for gathering the optical charges, and to improve the photosensitivity.

Then, as explained in FIG. 4, the device isolation layer 13 is formed in the STI process or the LOCOS process, thereby defining the active area and the device isolation area. After that, the gate insulating layer 121 and a conductive layer (for example, a highly doped polysilicon layer) are sequentially deposited on an entire surface of the epitaxial layer 11 including the device isolation layer 13, and then are selectively removed, thereby forming the gate insulating layer 121 and the gate electrode 123 of the respective transistors explained in FIG. 4. At this time, the gate insulating layer 121 may be formed in a thermal oxidation process or a CVD process. Also, the gate electrode may be formed in a method of forming a silicide layer on the conductive layer.

Figure 6B:
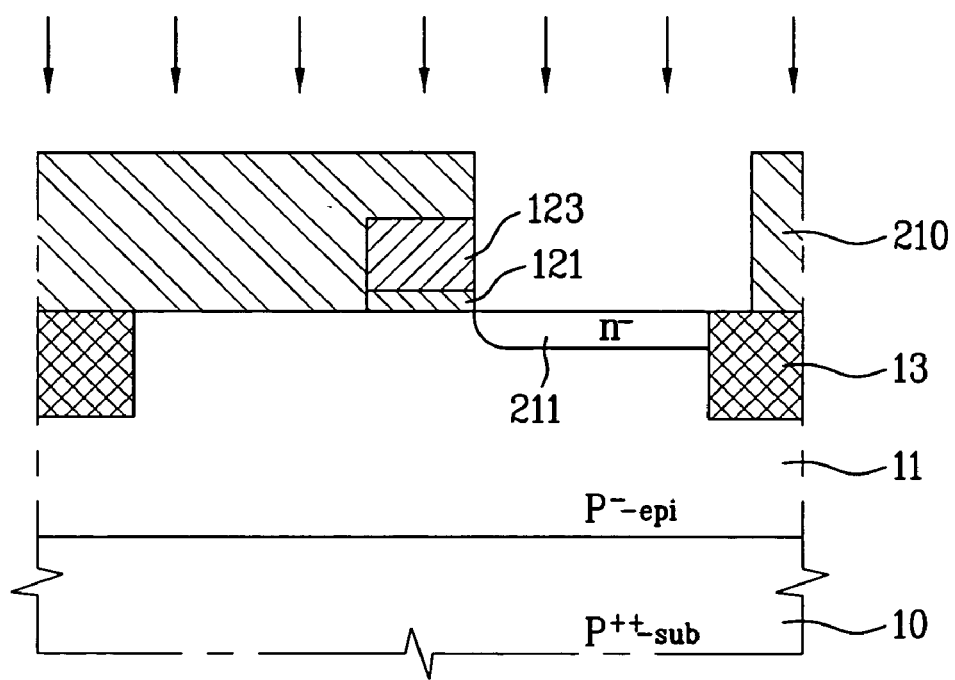

Referring to FIG. 6B, a first photoresist layer 210 is deposited on the entire surface of the semiconductor substrate 10 including the gate electrode 123, and then is patterned to cover the photodiode PD and to expose the source/drain regions of the respective transistors by exposure and development process. Thereafter, lightly doped second conductive type ($n^-$ type) impurity ions are implanted to the exposed source/drain regions by using the patterned first photoresist layer 210 as a mask, thereby forming the lightly doped $n^-$ type diffusion area 211.

Figure 6C:
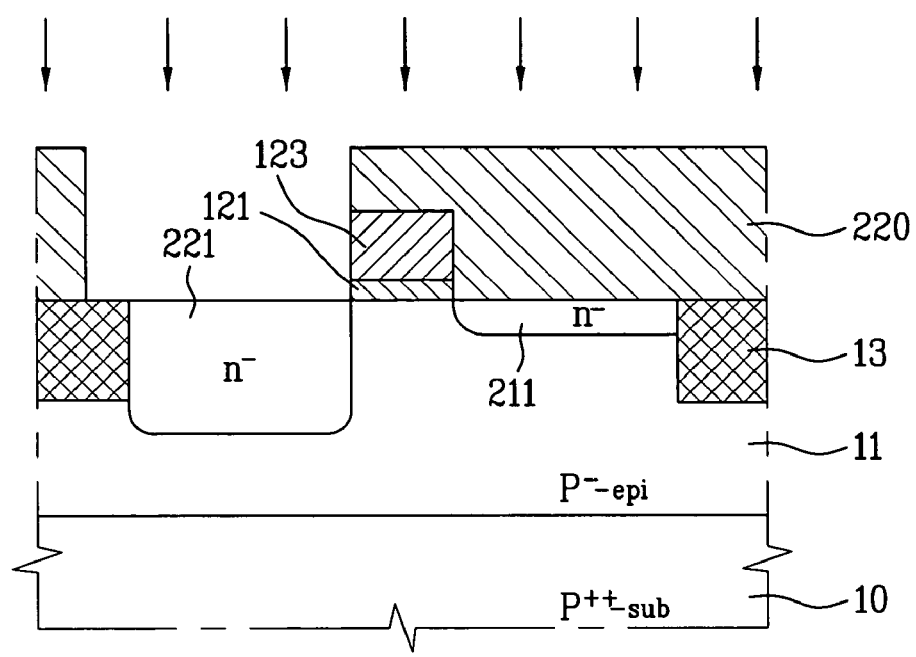

As shown in FIG. 6C, after removing the first photoresist layer 210, a second photoresist layer 220 is deposited on the entire surface of the semiconductor substrate 10, and then is patterned to expose the photodiode PD by exposure and development process. After that, lightly doped second conductive type ($n^-$ type) impurity ions are implanted to the epitaxial layer 11 by using the patterned second photoresist layer 220 as a mask, thereby forming the lightly doped $n^-$ type diffusion area 221 in the photodiode PD. At this time, when implanting the impurity ions to the photodiode PD so as to form the lightly doped $n^-$ type diffusion area 221, the impurity ions have greater energy and are implanted more deeply than those implanted so as to form the lightly doped $n^-$ type diffusion area 211 of the source/drain regions.

Figure 6D:
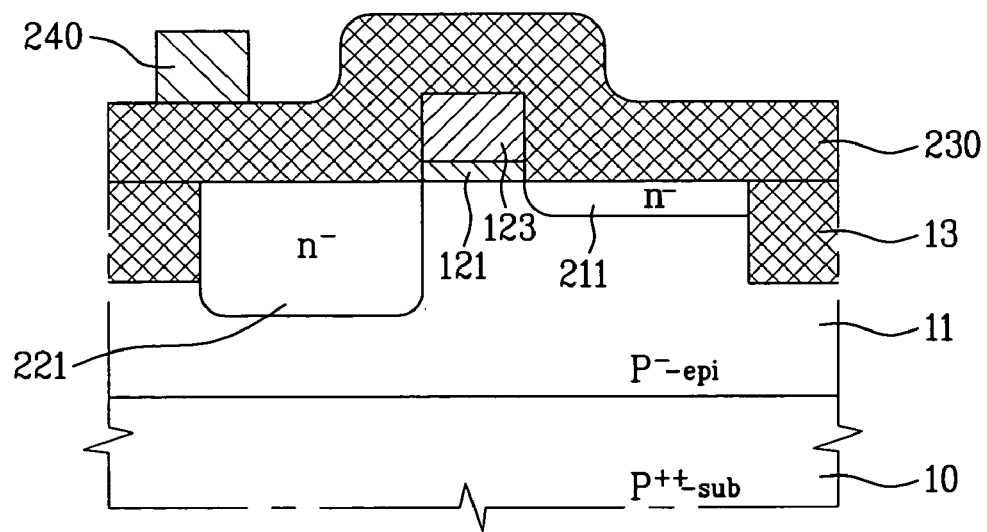

Referring to FIG. 6D, after removing the second photoresist layer 220, an insulating layer 230 of an oxide layer or a nitride layer, and a third photoresist layer 240 are sequentially deposited on the entire surface of the semiconductor substrate 10 by a CVD (chemical vapor deposition, low-pressure chemical vapor deposition) process. Then, the third photoresist layer 240 is patterned to remain on the boundary between the photodiode PD and the device isolation layer 13 by exposure and development process.

Figure 6E:
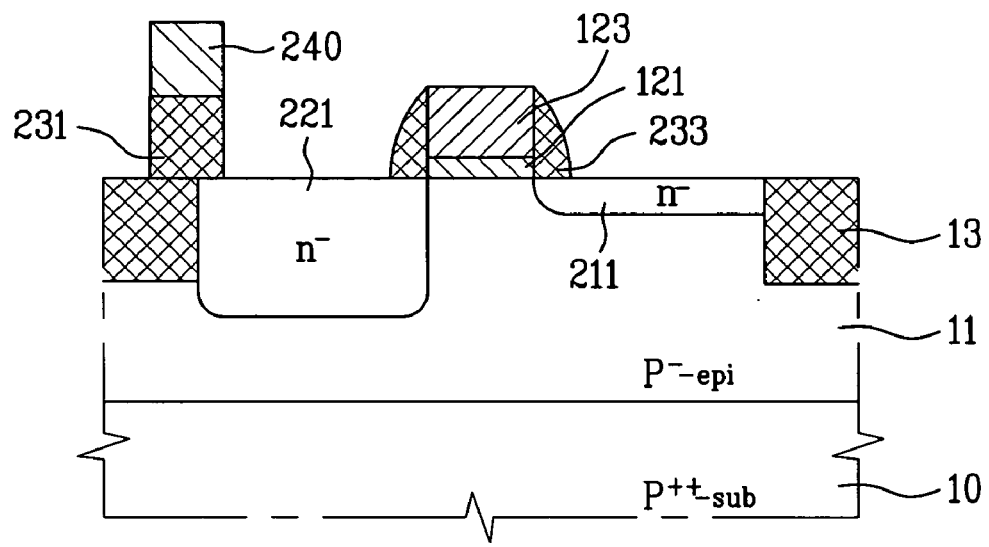

As shown in FIG. 6E, the insulating layer 230 is selectively removed by using the patterned third photoresist layer 240 as a mask, whereby the passivation layer 231 is formed on the boundary between the photodiode PD and the device isolation layer 13, and the insulating layers 233 are formed at both sidewalls of the gate electrode 123.

Figure 6F:
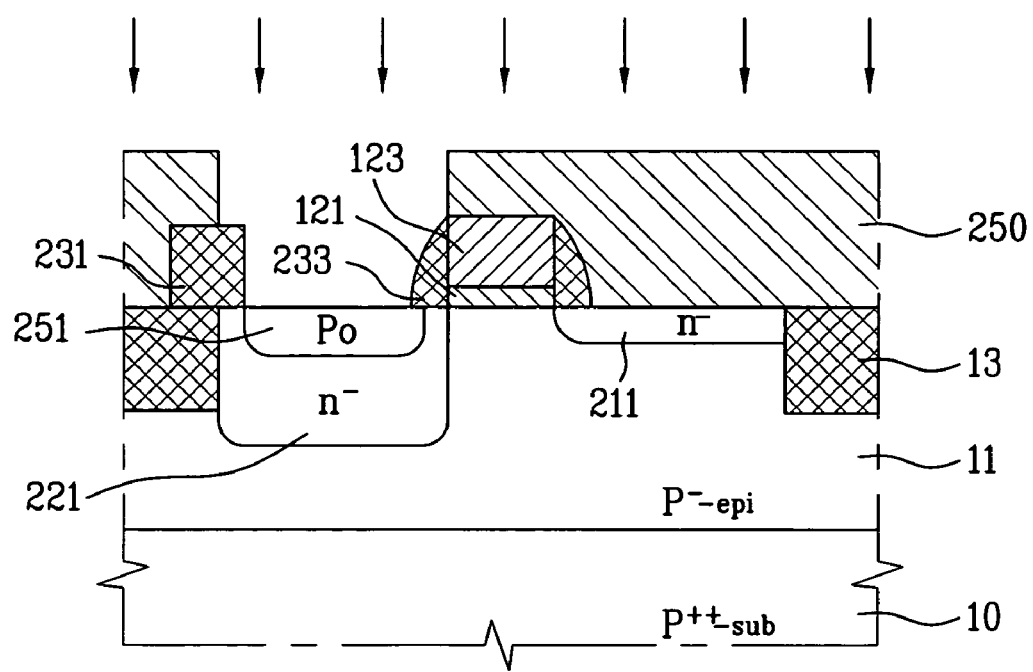

As shown in FIG. 6F, after removing the third photoresist layer 240, a fourth photoresist layer 250 is deposited on the entire surface of the semiconductor substrate 10 including the passivation layer 231 and the sidewall insulating layer 233, and then is patterned to expose the photodiode PD by exposure and development process. After that, medium doped first conductive type (P° type) impurity ions are implanted by using the patterned fourth photoresist layer 250 as a mask, thereby forming the P° type diffusion area 251 in the surface of the epitaxial layer 11 corresponding to the n⁻ type diffusion area 221 of the photodiode PD. At this time, the P° type diffusion area 251 is formed at the predetermined interval from the device isolation layer 13 and the gate electrode 123. That is, the sidewall insulating layer 233 and the passivation layer 231 are adjacent to the gate electrode 123 and the device isolation layer 13, so that the medium doped first conductive (P° type) impurity ions are not implanted to the photodiode PD formed below the sidewall insulating layer 233 and the passivation layer 231. At this time, it is possible to form the photodiode PD having the only n⁻ type diffusion area 221 without forming the P° type diffusion area 251.

Figure 6G:
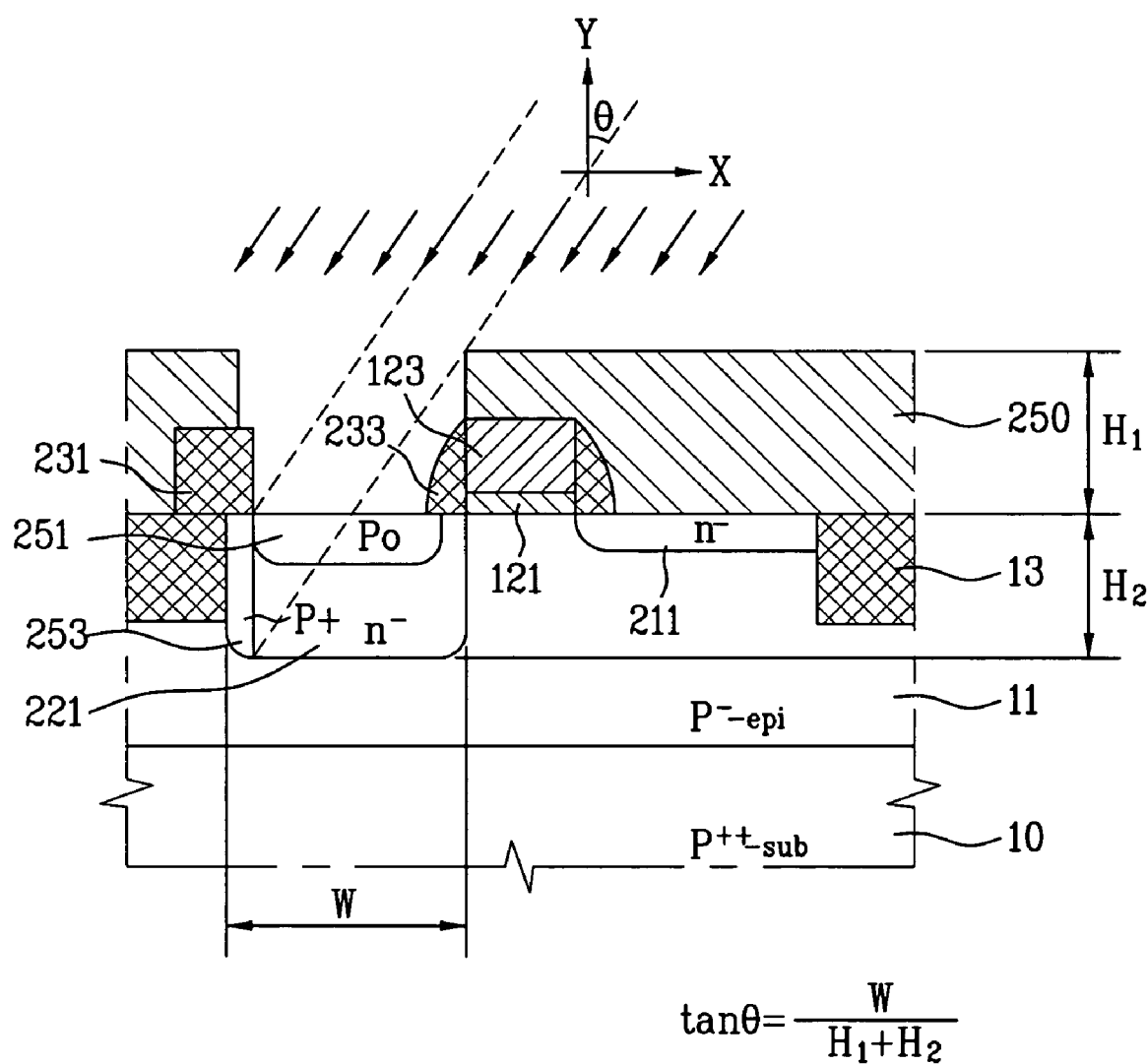

As shown in FIG. 6G, highly doped first conductive type (P⁺ type) impurity ions are tilt-implanted by using the fourth photoresist layer 250 as a mask, thereby forming the highly doped P⁺ type diffusion area 253 in the epitaxial layer 11 of the boundary between the device isolation layer 13 and the photodiode PD. At this time, the junction of the highly doped P⁺ type diffusion area 253 is formed at the same depth as that of the n⁻ type diffusion area 221, or is deeper than that of the n⁻ type diffusion area 221. Then, the impurity ions are tilt-implanted at an angle (θ) of satisfying 'tan θ=W/(H1+H2)'. Herein, 'H1' is a thickness of the fourth photoresist layer 250, 'H2' is a junction depth of the n⁻ type diffusion area 221, and 'W' is a width of the photodiode PD. Accordingly, the highly doped P⁺ type diffusion area 253 is formed between the n⁻ type diffusion area 221/P° type diffusion area 251 and the device isolation layer 13, thereby decreasing the darkcurrent generated in the boundary between the photodiode PD and the device isolation layer 13.

Figure 6H:
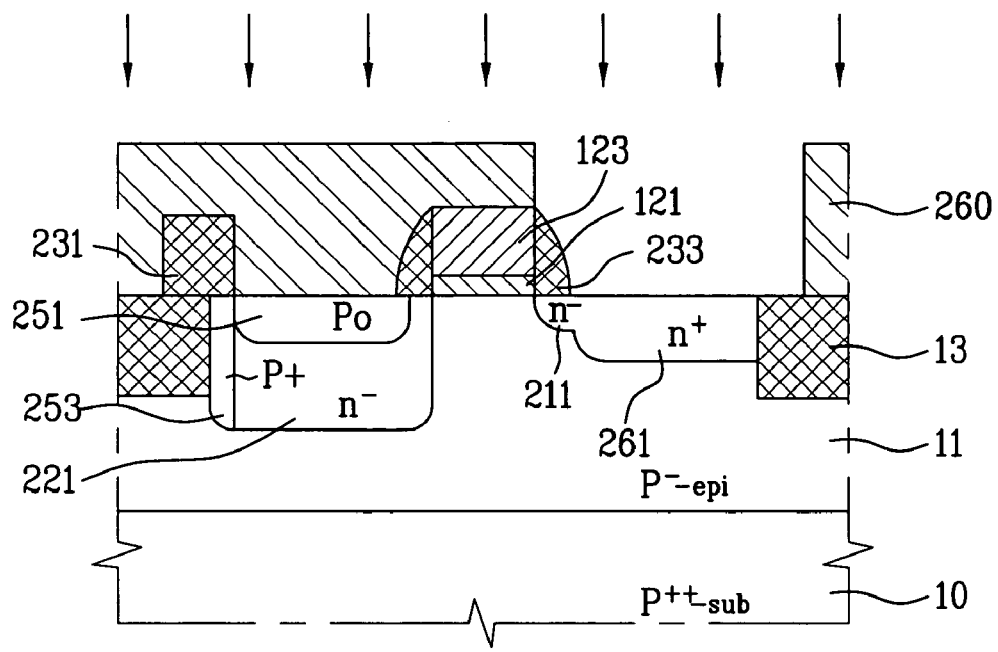

As shown in FIG. 6H, after removing the fourth photoresist layer 250, a fifth photoresist layer 260 is deposited on the entire surface of the semiconductor substrate 10, and then is patterned to cover the photodiode PD and to expose the source/drain regions of the respective transistors by exposure and development process. After that, highly doped second conductive type (n⁺ type) impurity ions are implanted to the exposed source/drain regions by using the patterned fifth photoresist layer 260 as a mask, thereby forming the highly doped n⁺ type diffusion area 261.

Figure 6I:
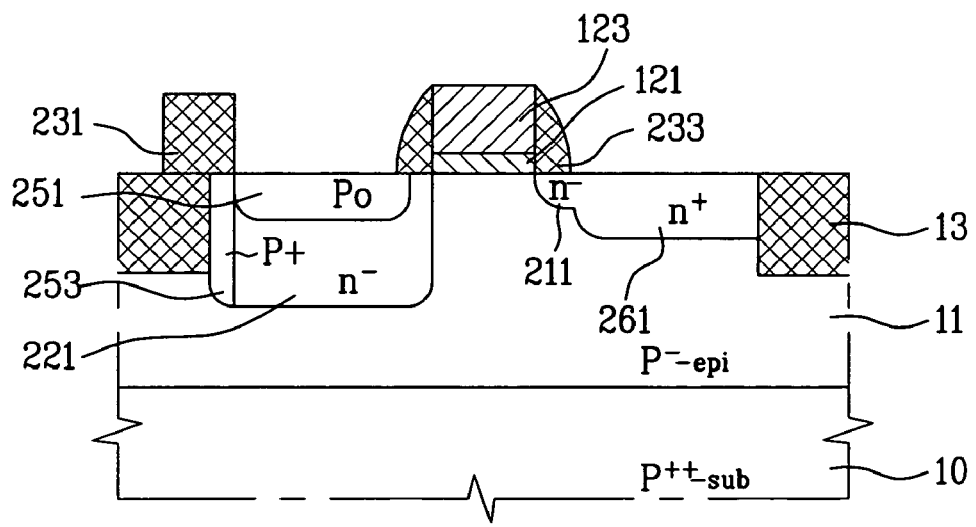

Referring to FIG. 6I, after removing the fifth photoresist layer 260, the implanted impurity ions are diffused in the n⁻ type diffusion area 221, the P° type diffusion area 251, the P⁺ type diffusion area 253, the n⁻ type diffusion area 211, and the n⁺ type diffusion area 261 by performing a thermal process (for example, a rapid thermal process). Thus, the junction of the n⁻ type diffusion area 221, the P° type diffusion area 251, the P⁺ type diffusion area 253, the n⁻ type diffusion area 211, and the n⁺ type diffusion area 261 is formed substantially. Simultaneously, although not shown, the junction of the n⁻ type diffusion area and the n⁺ type diffusion area in the reset transistor 130, the drive transistor 140, and the select transistor 150 of FIG. 4 is formed.

According to the aforementioned process, the CMOS image sensor according to the first embodiment of the present invention is completed.

Figure 7:
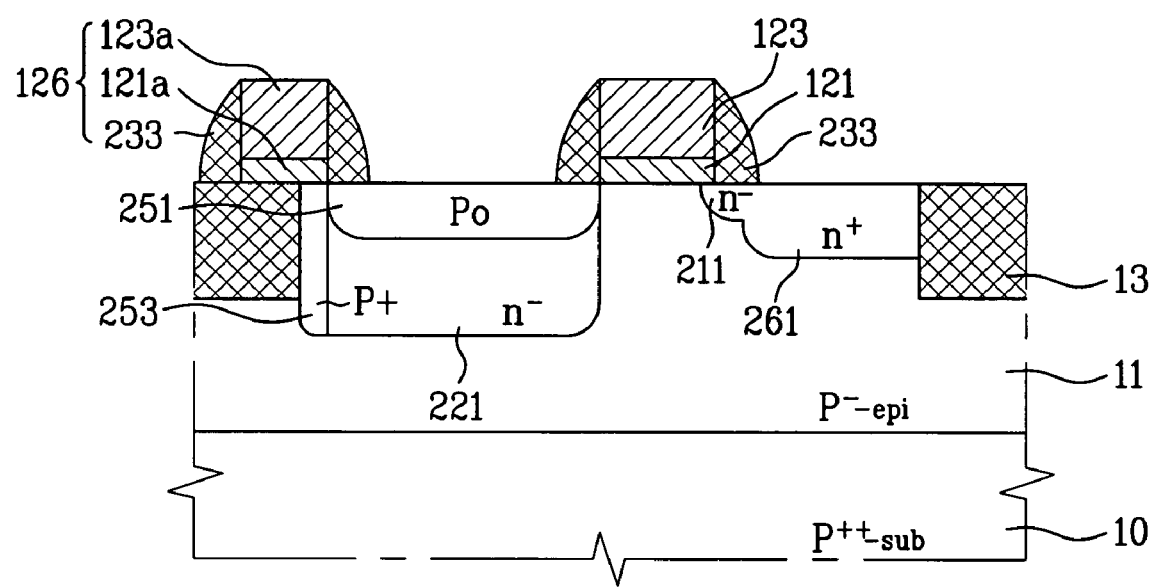
FIG. 7 is a cross sectional view of a photodiode along II–II' of FIG. 4 according to the second embodiment of the present invention.

Meanwhile, FIG. 7 is a cross sectional view of a photodiode along II–II' of FIG. 4 according to the second embodiment of the present invention. FIG. 8A to FIG. 8G are cross sectional views for the fabrication process of a CMOS image sensor along II–II' of FIG. 4 according to the second embodiment of the present invention.

In the CMOS image sensor according to the second embodiment of the present invention, as shown in FIG. 7, a P⁻ type epitaxial layer 11 is formed on a P⁺⁺ type semiconductor substrate 10. The semiconductor substrate 10 may be formed of a crystal silicon substrate. To define an active area, a device isolation layer 13 is formed in a device isolation area of the semiconductor substrate 10. The device isolation layer 13 may be formed in an STI (shallow trench isolation) process or an LOCOS (local oxidation of silicon) process. In this structure, a gate insulating layer 121 and a gate 123 are formed in the active area of the epitaxial layer 11 for the respective transistors explained in FIG. 4. Then, sidewall insulating layers 233 are formed at both sidewalls of the gate 123.

After that, an n⁻ type diffusion area 221 and a P° type diffusion area 251 are formed in the epitaxial layer 11 of a photodiode PD. The P° type diffusion area 251 is formed on the n⁻ type diffusion area 221. Also, source/drain regions S/D are formed of a highly doped n-type diffusion area N⁺ 261 and a lightly doped n-type diffusion area n⁻ 211. Then, a passivation layer 126 is formed on the boundary between the photodiode PD and the device isolation layer 13, and the passivation layer 126 is formed in a deposition structure of the gate insulating layer 121a, a gate electrode 123a, and the sidewall insulating layer 233. Also, a P⁺ type diffusion area 253 is formed below the passivation layer 231 in the boundary between the photodiode PD and the device isolation layer 13. The P⁺ type diffusion area 253 is formed in the epitaxial layer 11 of the boundary between the n⁻ type diffusion area 221/P° type diffusion area 251 and the device isolation layer 13. Herein, the P⁺ type diffusion area 253 has the same depth as the n⁻ type diffusion area 221. Or, the P⁺ type diffusion area 253 may be deeper than the n⁻ type diffusion area 221.

Meanwhile, as shown in the drawings, the photodiode PD has the n⁻ type diffusion area 221 and the P° type diffusion area 251. However, it is possible to provide the photodiode PD having the only n⁻ type diffusion area 221. At this time, P⁺⁺ type and P⁺ type mean the highly doped P type, P° type means the medium doped P type, and P⁻ type means the lightly doped P type. Also, n⁺ type means the highly doped n-type, and n⁻ type means the lightly doped n-type.

In case of the CMOS image sensor according to the second embodiment of the present invention, the n⁻ type diffusion area 221 and the P° type diffusion area 251 comprising the photodiode PD are positioned apart from the device isolation layer 13 by the P⁺ type diffusion area 253, whereby it is possible to decrease a darkcurrent generated in the boundary between the n⁻ type diffusion area 221/P° type diffusion area 251 and the device isolation layer 13. That is, the pair of electron and hole generated in the boundary between the device isolation layer 13 and the photodiode PD is recombined in the P⁺ type diffusion area 253, thereby decreasing the darkcurrent generated in the boundary.

A method for fabricating the CMOS image sensor according to the second embodiment of the present invention will be described as follows.

Figure 8A:
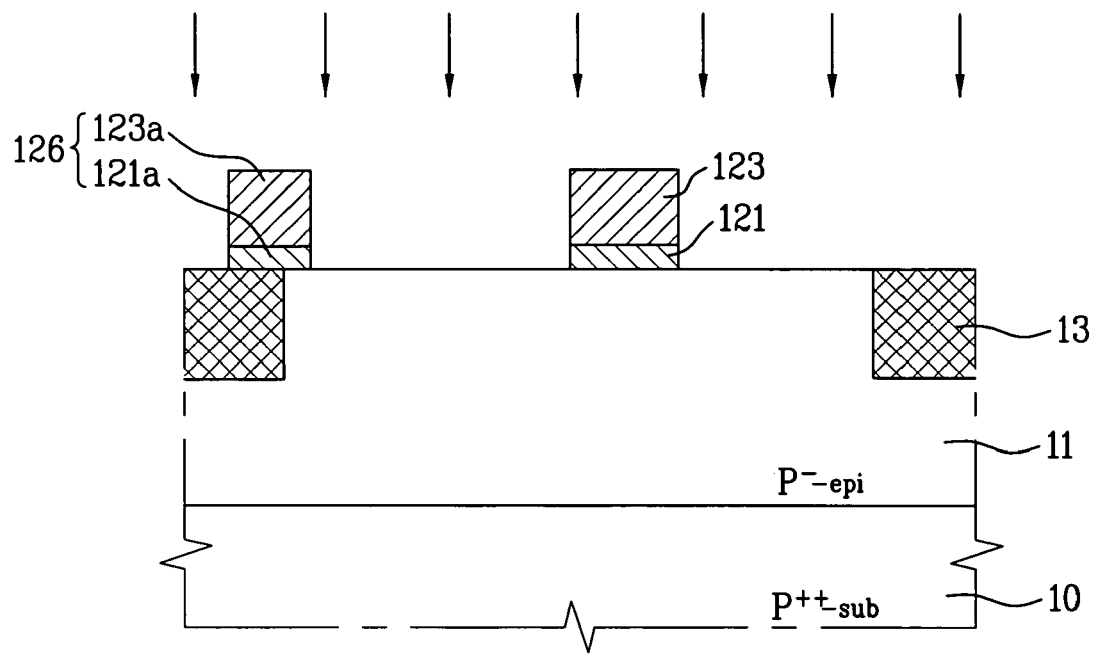
FIG. 8A to FIG. 8G are cross sectional views for the fabrication process of a CMOS image sensor along II–II' of FIG. 4 according to the second embodiment of the present invention.

As shown in FIG. 8A, the lightly doped first conductive type (P− type) epitaxial layer 11 is formed on the semiconductor substrate 10 of a highly doped first conductive type (P++ type) crystal silicon material by an epitaxial process. The epitaxial layer 11 has a large and deep depletion region in the photodiode PD, so as to improve the capacity of the low-voltage photodiode PD for gathering the optical charges, and to improve the photosensitivity. Then, as explained in FIG. 4, the device isolation layer 13 may be formed in the STI process or the LOCOS process, thereby defining the active area and the device isolation area.

After that, the gate insulating layer 121 and a conductive layer (for example, a highly doped polysilicon layer) are sequentially deposited on an entire surface of the epitaxial layer 11 including the device isolation layer 13, and then are selectively removed, thereby forming the gate insulating layer 121 and the gate electrode 123 of the respective transistors explained in FIG. 4. Simultaneously, the passivation layer 126 is formed on the boundary between the device isolation layer and the photodiode PD. That is, the passivation layer 126 is formed of the gate insulating layer 121a and the gate electrode 123a. At this time, the gate insulating layer 121 may be formed in a thermal oxidation process and a CVD process. Also, the gate electrode may be formed in a method of forming a silicide layer on the conductive layer.

Figure 8B:
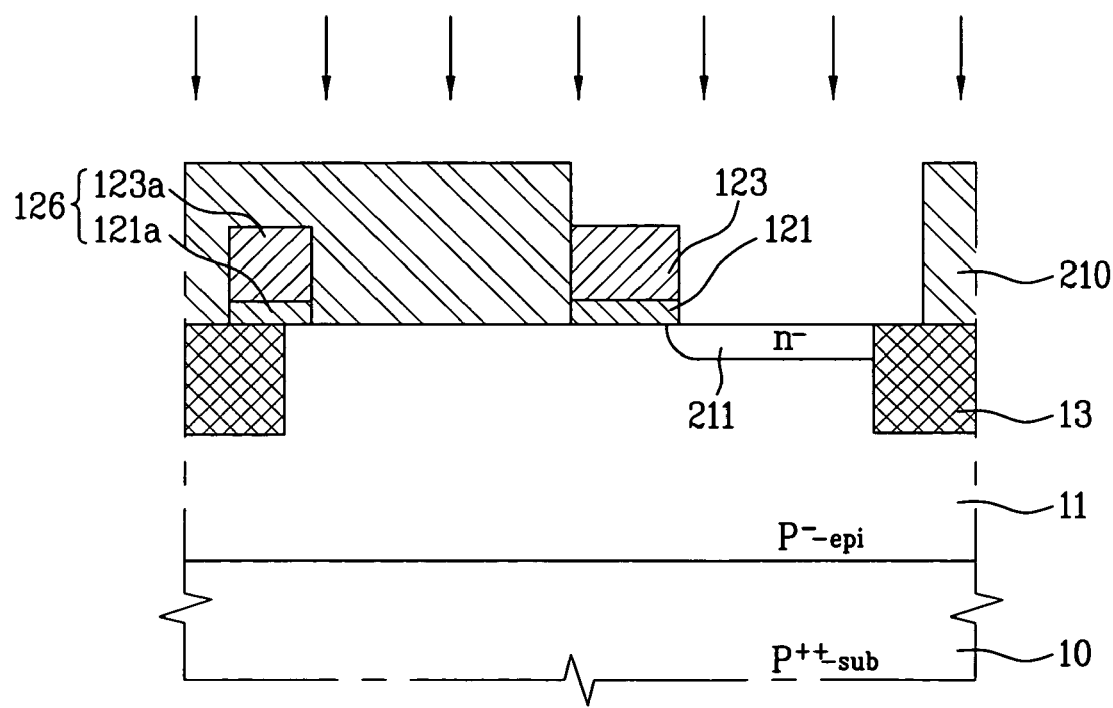

Referring to FIG. 8B, a first photoresist layer 210 is deposited on the entire surface of the semiconductor substrate 10 including the gate electrode 123, and then is patterned to mask the photodiode PD and to expose the source/drain regions of the respective transistors by exposure and development process. Thereafter, lightly doped second conductive type (n− type) impurity ions are implanted to the exposed source/drain regions by using the patterned first photoresist layer 210 as a mask, thereby forming the lightly doped n− type diffusion area 211.

Figure 8C:
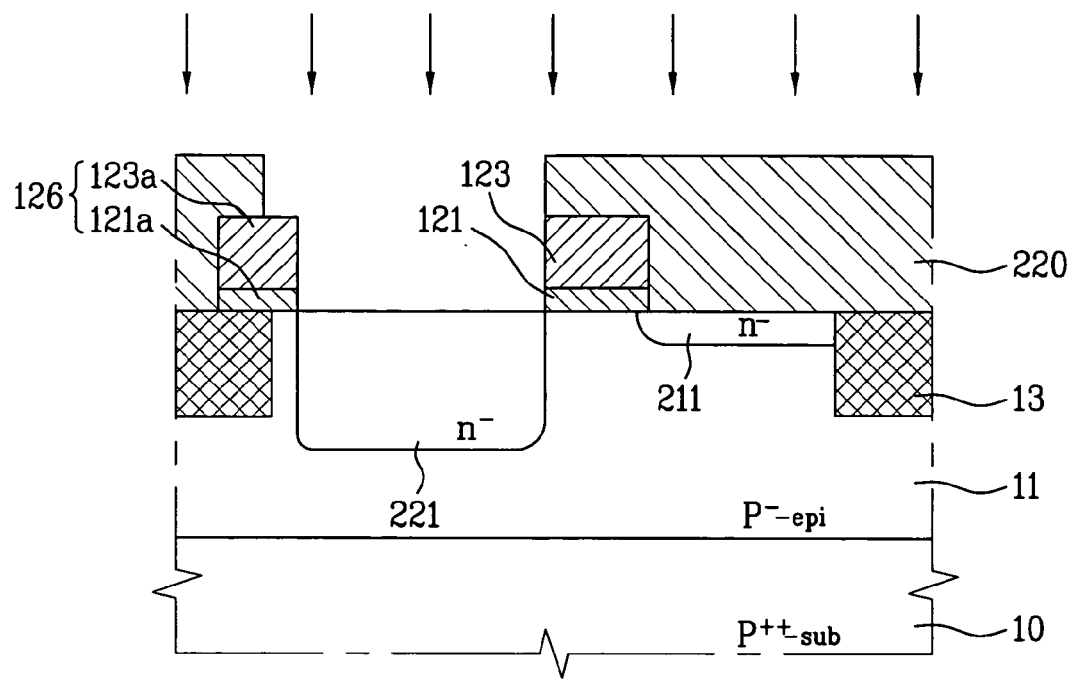

As shown in FIG. 8C, after removing the first photoresist layer 210, a second photoresist layer 220 is deposited on the entire surface of the semiconductor substrate 10, and then is patterned to expose the photodiode PD by exposure and development process. After that, lightly doped second conductive type (n− type) impurity ions are implanted to the epitaxial layer 11 by using the patterned second photoresist layer 220 as a mask, thereby forming the lightly doped n− type diffusion area 221 in the photodiode PD. Herein, when implanting the impurity ions to the photodiode PD so as to form the lightly doped n− type diffusion area 221, the impurity ions have greater energy and are implanted more deeply than those implanted so as to form the lightly doped n− type diffusion area 211 of the source/drain regions. At this time, the passivation layer 126 protects the periphery of the photodiode PD adjacent to the device isolation layer 13 from the implantation of the n-type impurity ions. Accordingly, the n− type diffusion area 221 is formed at a predetermined interval from the device isolation layer 13.

Figure 8D:
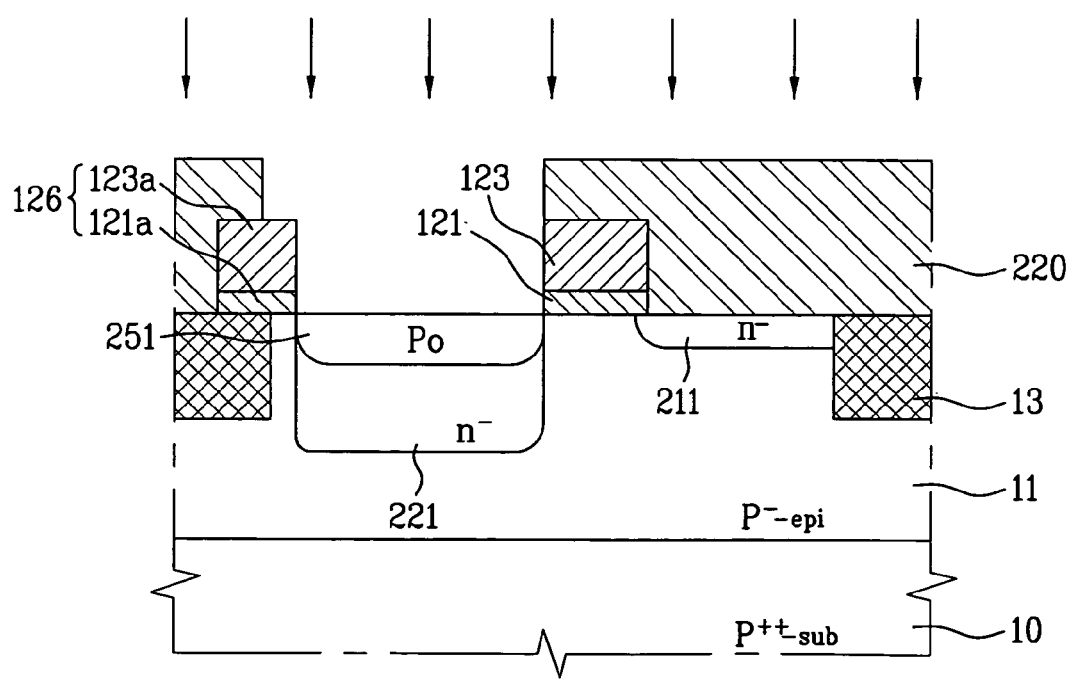

Referring to FIG. 8D, medium doped first conductive type (P° type) impurity ions are implanted to the surface of the lightly doped n-type (n− type) diffusion area 221 by using the patterned second photoresist layer 220 as a mask, thereby forming the medium doped P° type diffusion area 251. At this time, the passivation layer 126 protects the periphery of the photodiode PD adjacent to the device isolation layer 13 from the implantation of the n-type impurity ions. Thus, the P° type diffusion area 251 is formed at a predetermined interval from the device isolation layer 13. At this time, it is possible to form the photodiode PD having the only n− type diffusion area 221 without forming the P° type diffusion area 251.

Figure 8E:
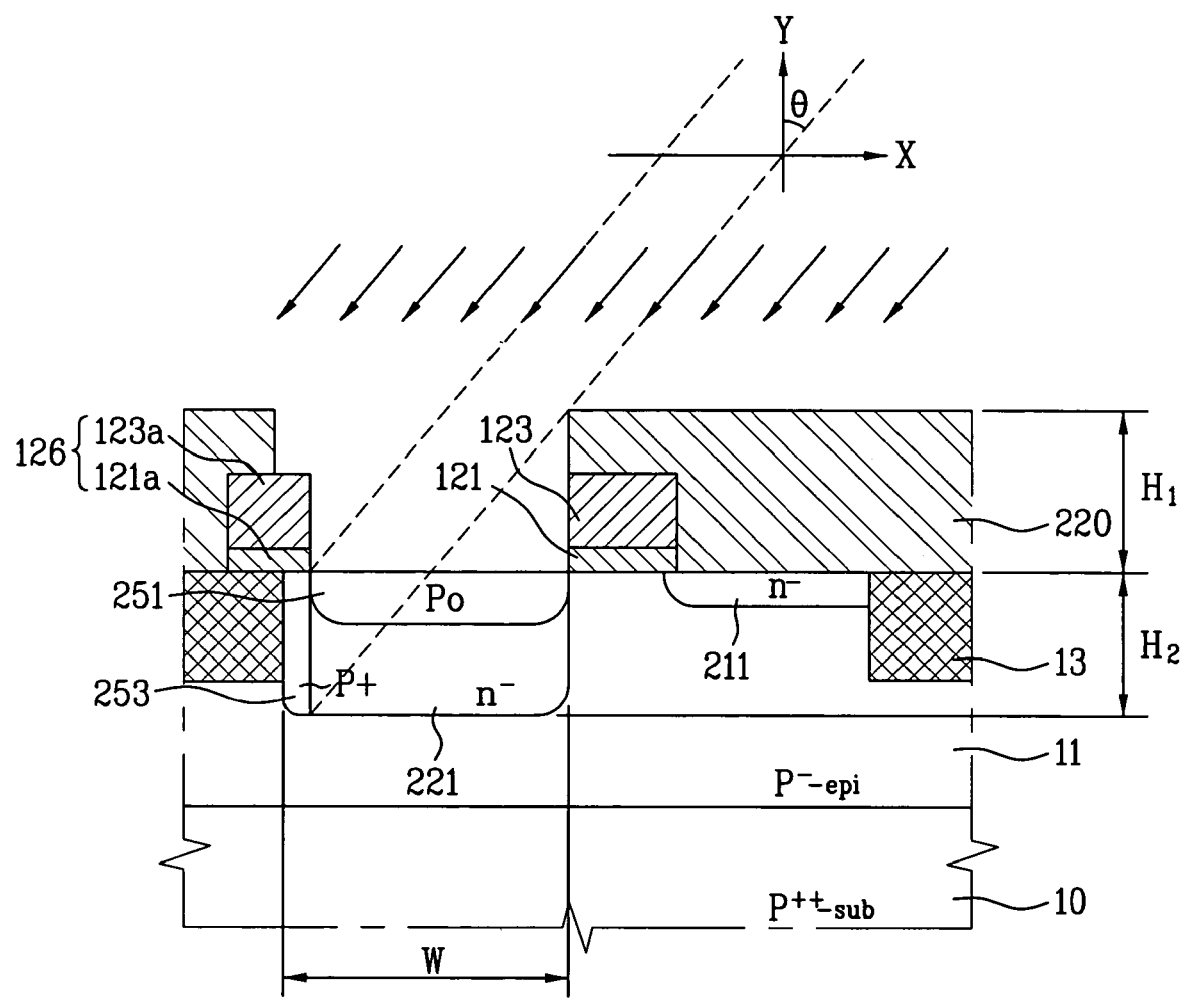

Referring to FIG. 8E, highly doped first conductive type (P+ type) impurity ions are tilt-implanted by using the patterned second photoresist layer 220 as a mask, thereby forming the highly doped P+ type diffusion area 253 in the epitaxial layer 11 of the boundary between the device isolation layer 13 and the photodiode PD. At this time, the junction of the highly doped P+ type diffusion area 253 is formed at the same depth as that of the n− type diffusion area 221, or is deeper than that of the n− type diffusion area 221. Then, the ions are tilt-implanted at an angle (θ) of satisfying 'tan θ=W/(H1+H2)'. Herein, 'H1' is a thickness of the second photoresist layer 220, 'H2' is a junction depth of the n− type diffusion area 221, and 'W' is a width of the photodiode PD. Accordingly, the highly doped P+ type diffusion area 253 is formed between the n− type diffusion area 221/P° type diffusion area 251 and the device isolation layer 13, whereby it is possible to decrease the darkcurrent generated in the boundary between the photodiode PD and the device isolation layer 13. In addition, the pair of electron and hole generated in the boundary between the device isolation layer 13 and the periphery of the active area for the photodiode PD is recombined in the P+ type diffusion area 253, thereby decreasing the darkcurrent generated in the boundary.

Figure 8F:
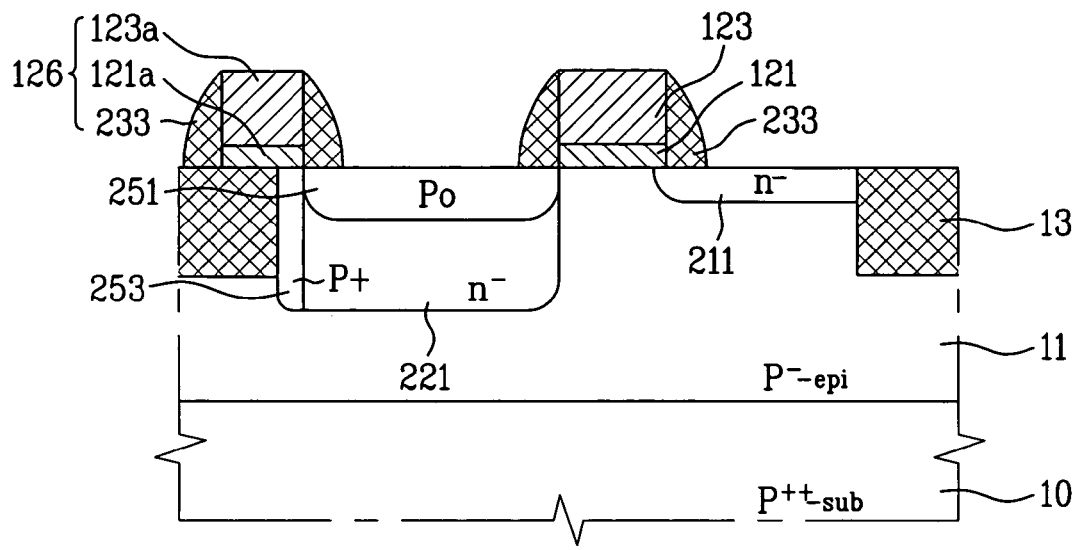

Referring to FIG. 8F, after removing the second photoresist layer 220, an insulating layer of an oxide layer or a nitride layer is deposited on the entire surface of the semiconductor substrate 10 including the gate electrode 123 by a CVD (chemical vapor deposition, low-pressure chemical vapor deposition) process. Then, the insulating layer is selectively removed in an etch-back process, thereby forming the sidewall insulating layers 233 at both sidewalls of the gate electrode 123, and forming the sidewall insulating layers 233 at both sidewalls of the passivation layer 126. Simultaneously, although not shown, the sidewall insulating layers 233 are formed at both sidewalls of the gate electrode for the reset transistor 130, the drive transistor 140, and the select transistor 150 explained in FIG. 4.

Figure 8G:
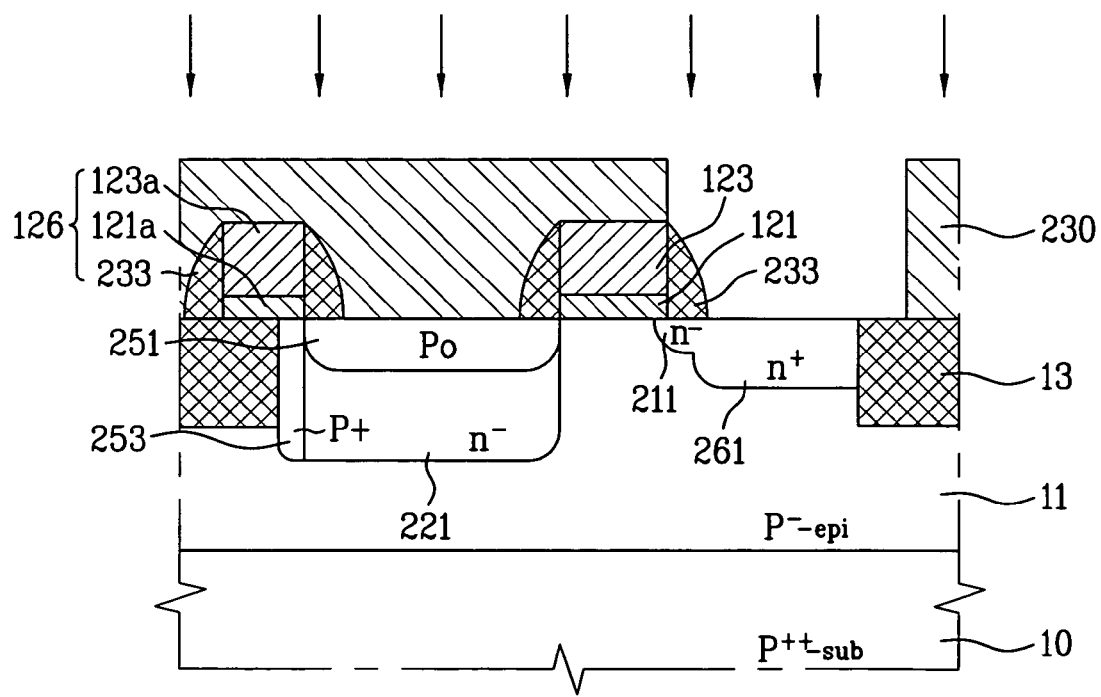

As shown in FIG. 8G, a third photoresist layer 230 is deposited on the entire surface of the semiconductor substrate 10, and then is patterned to cover the photodiode PD and to expose the active area of the source/drain regions S/D for the respective transistors by exposure and development process. That is, the n− type diffusion area 211 for the reset transistor 130, the drive transistor 140, and the select transistor 150 explained in FIG. 4 is exposed, and the P° type diffusion area 251 and the gate electrode 123 are masked. Then, the highly doped n-type impurity ions are implanted by using the patterned third photoresist layer 230 as a mask, thereby forming the n+ type diffusion area 261 in the source/drain regions. Simultaneously, although not shown, the n+ type diffusion for the source/drain regions of the reset transistor 130, the drive transistor 140, and the select transistor 150 is formed.

After removing the third photoresist layer 230, the impurity ions are diffused in the n− type diffusion area 221, the P° type diffusion area 251, the P+ type diffusion area 253, the n− type diffusion area 211, and the n+ type diffusion area 261 by performing a thermal process (for example, a rapid thermal process). As a result, it is possible to form the junction of the n− type diffusion area 221, the P° type diffusion area 251, the P+ type diffusion area 253, the n− type diffusion area 211, and the n+ type diffusion area 261. Although not shown, the junction of the n− type diffusion area and the n− type diffusion area in the reset transistor 130, the drive transistor 140, and the select transistor 150 of FIG. 4 is formed. According to the aforementioned process, the CMOS image sensor according to the second embodiment of the present invention is completed.

Figure 9:
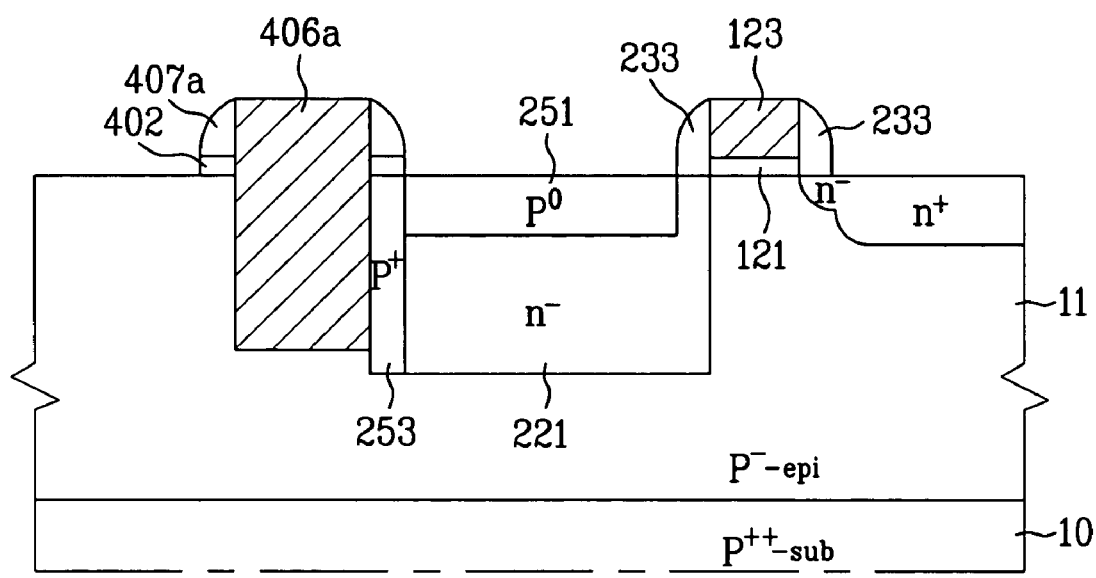
FIG. 9 is a cross sectional view of a photodiode along II–II' of FIG. 4 according to the third embodiment of the present invention.

Meanwhile, FIG. 9 is a cross sectional view of a photodiode along II–II' of FIG. 4 according to the third embodiment of the present invention. FIG. 10A to FIG. 10J are cross sectional views for the fabrication process of a CMOS image sensor along II–II' of FIG. 4 according to the third embodiment of the present invention.

In the CMOS image sensor according to the third embodiment of the present invention, as shown in FIG. 9, a P⁻ type epitaxial layer 11 is formed on a P⁺⁺ type semiconductor substrate 10. The semiconductor substrate 10 may be formed of a crystal silicon substrate. To define an active area, a device isolation layer 406a is formed in a device isolation area of the semiconductor substrate 10. The device isolation layer 406a is formed to have a higher surface than that of the epitaxial layer 11. In this structure, a gate insulating layer 121 and a gate 123 are formed in the active area of the epitaxial layer 11 for the transfer transistor 120, the reset transistor 130, the drive transistor 140, and the select transistor 150 explained in FIG. 4. Also, sidewall insulating layers 233 are formed at both sidewalls of the gate 123.

After that, an n⁻ type diffusion area 221 and a P° type diffusion area 251 are formed in the epitaxial layer 11 of a photodiode PD. The P° type diffusion area 251 is formed on the n⁻ type diffusion area 221. Also, source/drain regions S/D are formed of a highly doped n-type diffusion area N⁺ and a lightly doped n-type diffusion area n⁻. Then, a scrificing oxide layer 402 and an ion implantation prevention layer 407a are deposited at both sides of the device isolation layer 406a. Also, a highly doped P⁺ type diffusion area 253 is formed below the ion implantation prevention layer 407a in the boundary between the device isolation layer 406a and the n⁻ type diffusion area 221/P° type diffusion area 251. The P⁺ type diffusion area 253 is formed in the epitaxial layer 11 between the n⁻ type diffusion area 221/P° type diffusion area 251 and the device isolation layer 406a. Herein, the P⁺ type diffusion area 253 has the same depth as the n⁻ type diffusion area 221. Or, the P⁺ type diffusion area 253 may be deeper than the n⁻ type diffusion area 221.

Meanwhile, as shown in the drawings, the photodiode PD has the n⁻ type diffusion area 221 and the P° type diffusion area 251. However, it is possible to provide the photodiode PD having the only n⁻ type diffusion area 221. At this time, P⁺⁺ type and P⁺ type mean the highly doped P type, P° type means the medium doped P type, and P- type means the lightly doped P type. Also, n⁺ type means the highly doped n-type, and n⁻ type means the lightly doped n-type.

In case of the CMOS image sensor according to the third embodiment of the present invention, the n⁻ type diffusion area 221 and the P° type diffusion area 251 comprising the photodiode PD are positioned apart from the device isolation layer 406a by the P⁺ type diffusion area 253, whereby it is possible to decrease a darkcurrent generated in the boundary between the n⁻ type diffusion area 221/P° type diffusion area 251 and the device isolation layer 406a. That is, the pair of electron and hole generated in the boundary between the device isolation layer 406a and the photodiode PD is recombined in the P⁺ type diffusion area 253, thereby decreasing the darkcurrent generated in the boundary.

A method for fabricating the CMOS image sensor according to the third embodiment of the present invention will be described as follows.

Figure 10A:
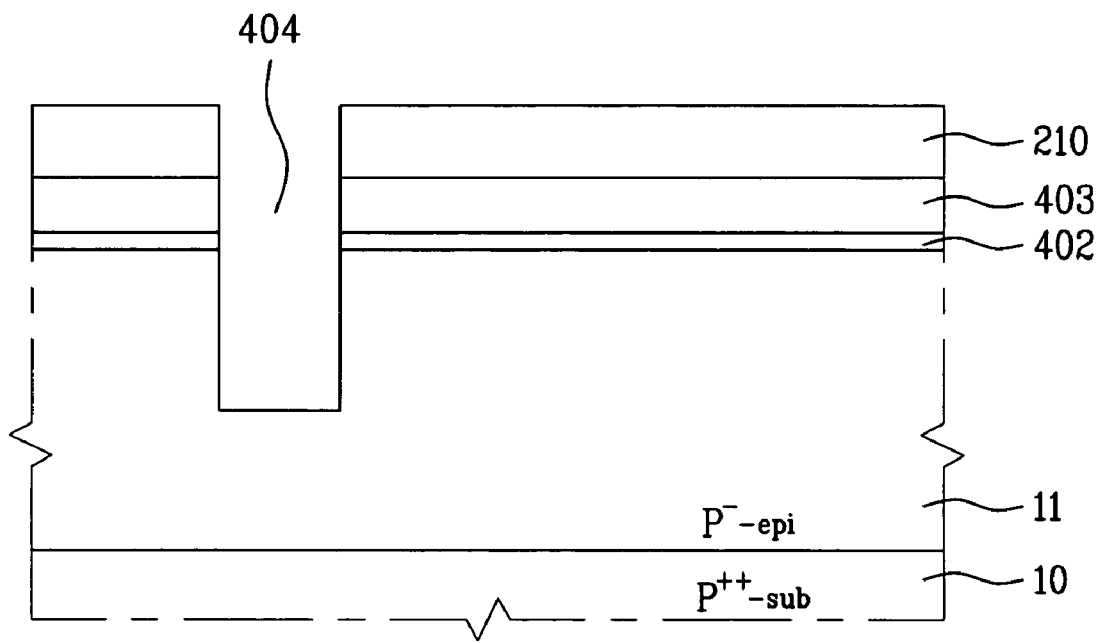
FIG. 10A to FIG. 10J are cross sectional views for the fabrication process of a CMOS image sensor along II–II' of FIG. 4 according to the third embodiment of the present invention.

As shown in FIG. 10A, the lightly doped first conductive type (P⁻ type) epitaxial layer 11 is formed on the semiconductor substrate 10 of a highly doped first conductive type (P⁺⁺ type) crystal silicon material by an epitaxial process. The epitaxial layer 11 has a large and deep depletion region in the photodiode PD, so as to improve the capacity of the low-voltage photodiode PD for gathering the optical charges, and to improve the photosensitivity.

Then, a high-temperature thermal oxidation process is performed on the entire surface of the epitaxial layer 11, whereby the scrificing oxide layer 402 is formed at a thickness of 40 Å to 150 Å. Subsequently, a scrificing nitride layer 403 is deposited at a thickness of 500 Å to 1500 Å on the scrificing oxide layer 402 by a low-pressure chemical vapor deposition process. The scrificing oxide layer 402 relieves the stress of the scrificing nitride layer 403 for the epitaxial layer 11. Also, the scrificing nitride layer 403 serves as a mask layer for forming a trench, and serves as an etch-stop layer in a following CMP process.

Subsequently, a first photoresist layer 210 is deposited on the scrificing nitride layer 403, and then is patterned to expose the scrificing nitride layer 403 of the device isolation area by exposure and development process. Thereafter, the scrificing nitride layer 403 and the scrificing oxide layer 402 are selectively removed by using the patterned first photoresist layer 210 as a mask, thereby exposing the epitaxial layer 11 corresponding to the device isolation area. Then, the epitaxial layer 11 is selectively removed by using the scrificing nitride layer 403 as a mask, thereby forming the trench 404 in the device isolation area.

Figure 10B:
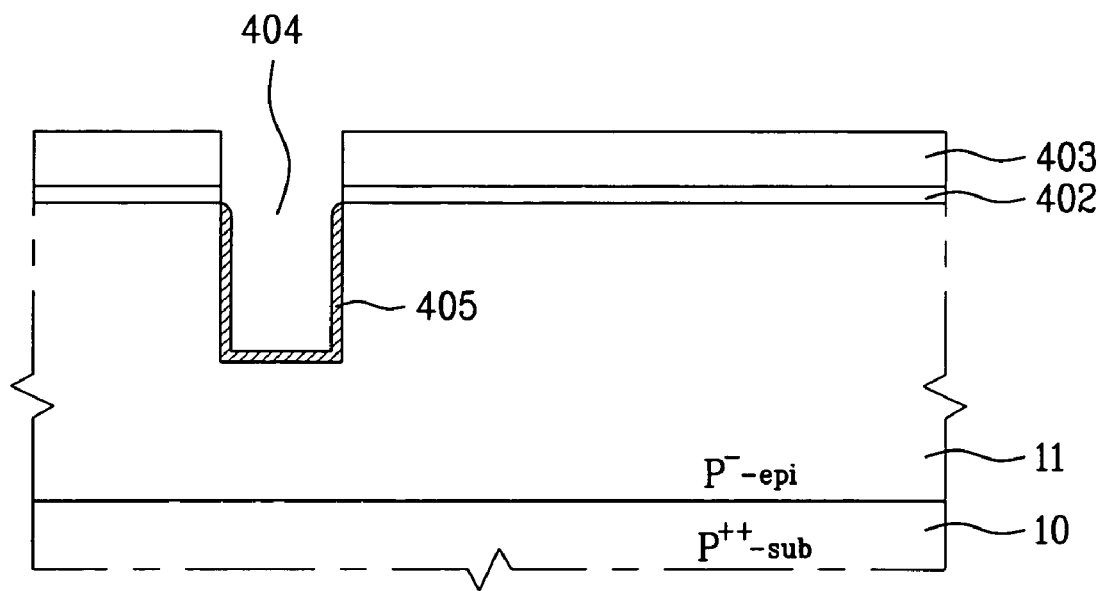

Referring to FIG. 10B, after removing the first photoresist layer 210, a thermal oxide layer 405 is formed at a thickness of 200 Å to 800 Å on an inner surface of the trench 404 in a thermal oxidation process of using the scrificing nitride layer 403 as a mask. After forming the trench 404, the thermal oxide layer 405 is formed to cure the surface of the epitaxial layer 11 inside the trench 404 damaged by plasma, more specifically, to remove dangling bond generated on the surface of the epitaxial layer 11 inside the trench 404 by atomic arrangement. Also, the thermal oxide layer 405 improves the adhesion to the device isolation layer. At this time, the thermal oxide layer 405 may be formed or not, selectively.

Figure 10C:
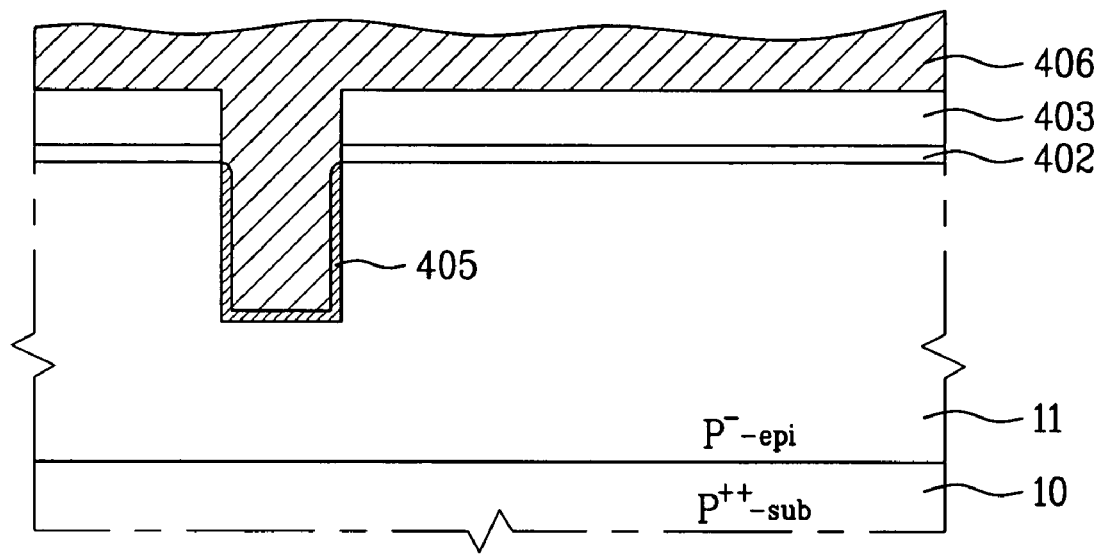

As shown in FIG. 10C, when a device isolation-insulating layer 406 is formed on the scrificing insulating layer 403 including the trench 404, the device isolation-insulating layer 406 is formed at a sufficient thickness to fill the trench 404. Preferably, the device isolation-insulating layer 406 has no void therein. Also, the device isolation-insulating layer 406 may be formed in O₃-TEOS (Tetra-Ethyl-Ortho-Silicate) APCVD (Atmosphere Pressure Chemical Vapor Deposition) process or HDPCVD (High Density Plasma Chemical Vapor Deposition) process according to a design rule of a semiconductor device. Meanwhile, for the convenience, it is explained as the device isolation-insulating layer 406 is formed of a single layer. However, the device isolation-insulating layer 406 may be formed of a dual-layered deposition layer of an oxide layer and a nitride layer.

Figure 10D:
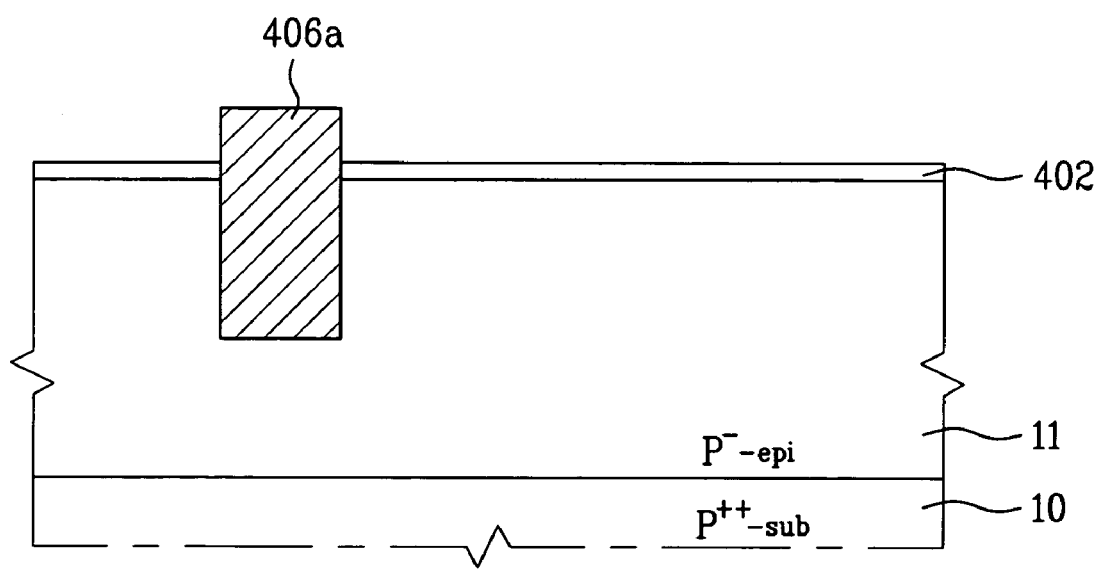

Referring to FIG. 10D, the device isolation-insulating layer 406 is planarized to expose the surface of the scrificing nitride layer 403 by a CMP process. Then, the scrificing nitride layer 403 is removed in a wet-etch process using a phosphoric acid solution, thereby forming the device isolation layer 406a. The device isolation layer 406a has a projection shape from the surface of the epitaxial layer 11 at an extent corresponding to a thickness of the scrificing nitride layer 403.

Figure 10E:
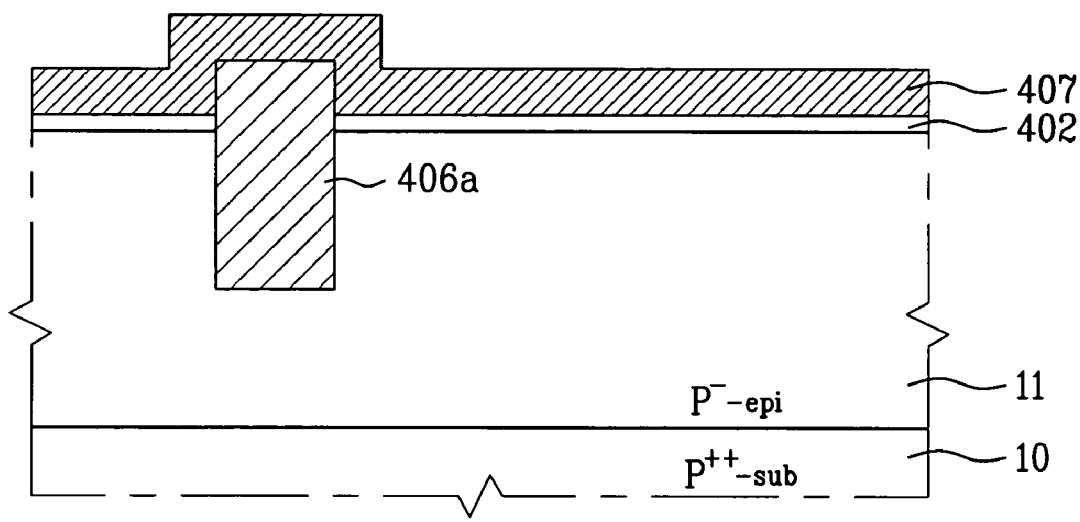

As shown in FIG. 10E, a nitride layer 407 is deposited at a thickness of 500 Å to 1500 Å on the entire surface of the substrate including the device isolation layer 406a by a low-pressure chemical vapor deposition process.

Figure 10F:
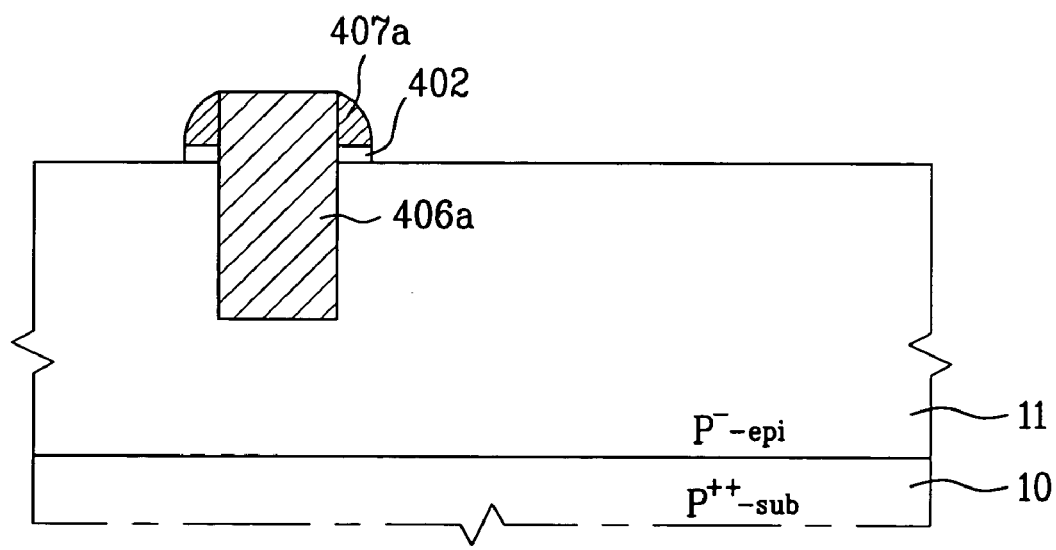

Referring to FIG. 10F, the nitride layer 407a and the scrificing oxide layer 402 are removed in an anisotropic etch process such as an etch-back process, thereby forming the ion implantation prevention layer 407a at the side of the device isolation layer 406a.

Figure 10G:
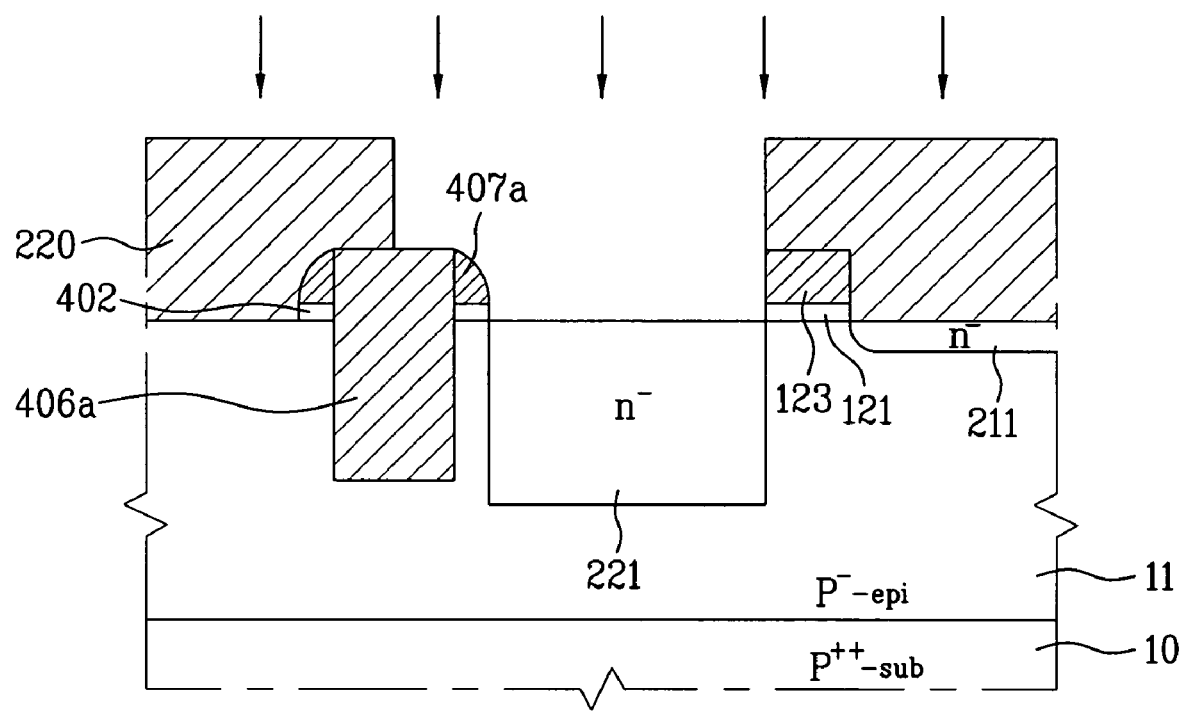

As shown in FIG. 10G, the gate insulating layer 121 and a conductive layer are sequentially deposited on the entire surface of the substrate including the device isolation layer 406a and the ion implantation prevention layer 407a, and then are selectively removed to form the gate electrode 123 of the respective transistors and the gate insulating layer 121. Then, lightly doped n-type (n⁻ type) impurity ions are implanted to the source/drain regions by using the gate electrode 123 as a mask, thereby forming the lightly doped n⁻ type diffusion area 211.

Subsequently, a second photoresist layer 220 is deposited on the entire surface of the substrate including the gate electrode 123, and then is patterned to expose the epitaxial layer 11 of the photodiode PD by exposure and development process. After that, lightly doped n type impurity ions are implanted to the photodiode PD by using the patterned second photoresist layer 220 as a mask, thereby forming the lightly doped n⁻ type diffusion area 221. Herein, when implanting the impurity ions to the photodiode PD so as to form the lightly doped n⁻ type diffusion area 221, the impurity ions have greater energy, whereby the impurity ions are implanted deeply.

Figure 10H:
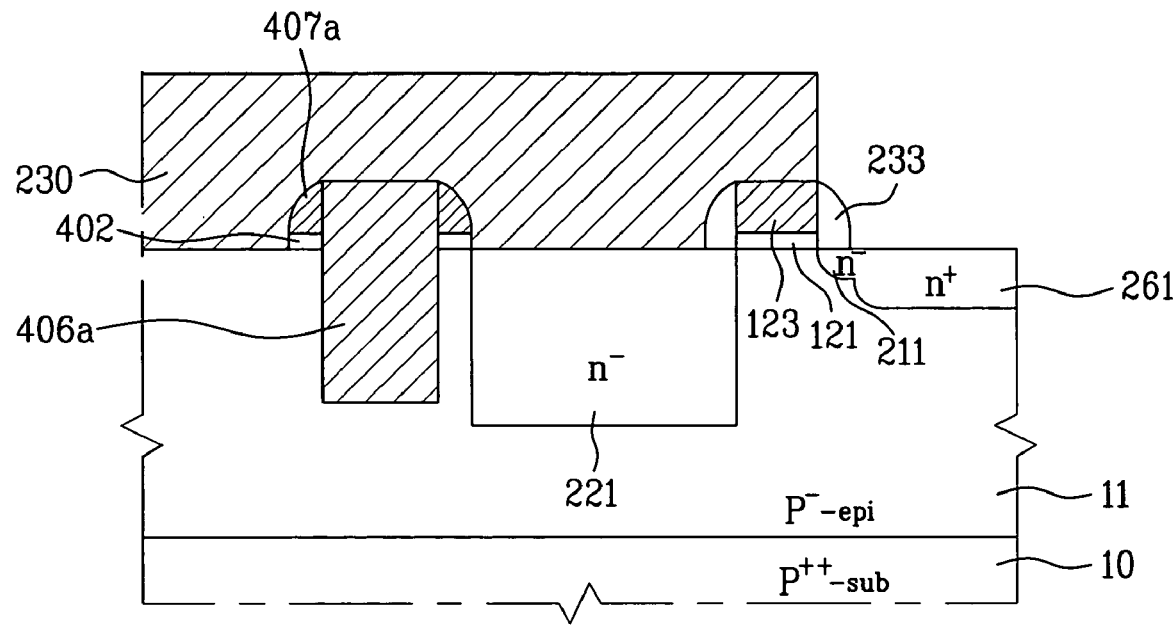

As shown in FIG. 10H, after removing the second photoresist layer 220, an insulating layer is deposited on the entire surface of the substrate including the gate electrode, and then is anisotropically etched, thereby forming the sidewall insulating layer 233 at the sidewall of the gate electrode 123. Thereafter, a third photoresist layer 230 is deposited on the entire surface of the substrate including the sidewall insulating layer 233 and the gate electrode 123, and then is patterned to mask the photodiode PD and to expose the source/drain regions by exposure and development process. Then, highly doped n-type impurity ions are implanted to the source/drain regions by using the patterned third photoresist layer 230 as a mask, thereby forming the highly doped n-type diffusion area 261.

Figure 10I:
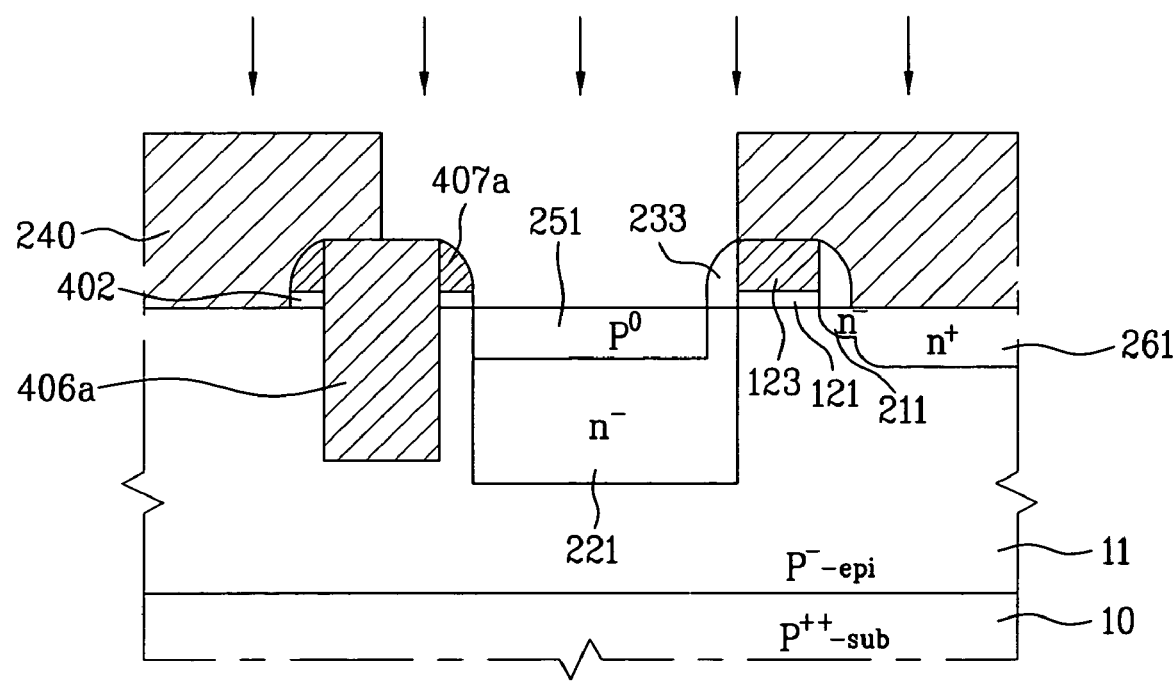

Referring to FIG. 10I, after removing the third photoresist layer 230, a fourth photoresist layer 240 is formed on the entire surface of the substrate, and then is patterned to expose the photodiode PD by exposure and development process. After that, medium doped P° type impurity ions are implanted by using the patterned fourth photoresist layer 240 as a mask, thereby forming the medium doped P° type diffusion area 251 in the surface of the lightly doped n-type diffusion area 221 of the photodiode PD.

The medium doped P° type diffusion area 251 decreases the darkcurrent generated in the surface of the substrate corresponding to the photodiode PD. That is, when implanting the lightly doped n⁻ type impurity ions so as to form the photodiode PD, it may cause the defect in the surface of the photodiode PD, whereby charge carrier may generate due to the defect. As a result, as the generated charge carrier moves to the source/drain regions, it generates the darkcurrent. Accordingly, it is possible to prevent the darkcurrent by gathering the charge carrier on the medium doped P° type diffusion area 251.

Figure 10J:
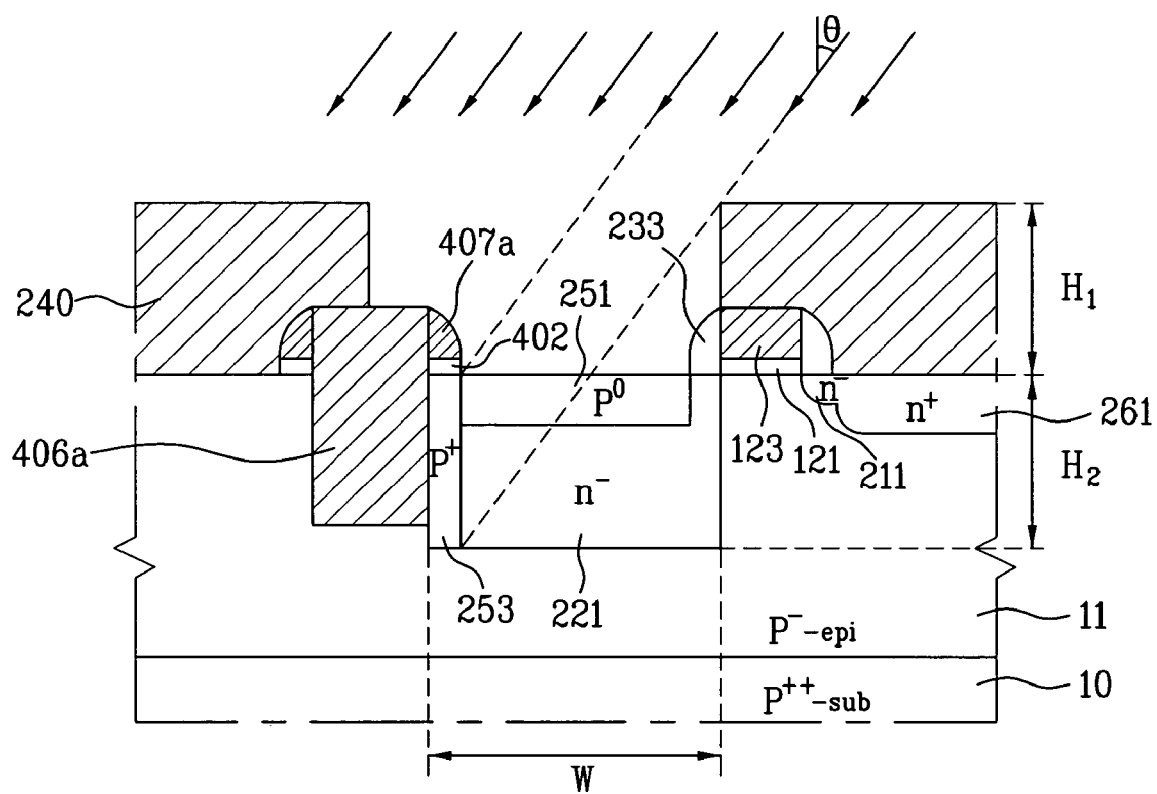

Referring to FIG. 10J, in state of forming the patterned fourth photoresist layer 240, highly doped first conductive type (P⁺ type) impurity ions are tilt-implanted, thereby forming the highly doped P⁺ type diffusion area 253 in the epitaxial layer 11 of the boundary between the device isolation layer 406a and the photodiode PD. At this time, the junction of the highly doped P⁺ type diffusion area 253 is formed at the same depth as that of the n⁻ type diffusion area 221, or is deeper than that of the n⁻ type diffusion area 221. Then, the impurity ions are tilt-implanted at an angle (θ) of satisfying 'tan θ=W/(H1+H2)'. Herein, 'H1' is a thickness of the fourth photoresist layer 250, 'H2' is a junction depth of the n⁻ type diffusion area 221, and 'W' is a width of the photodiode PD. Accordingly, the highly doped P⁺ type diffusion area 253 is formed between the n⁻ type diffusion area 221/P° type diffusion area 251 and the device isolation layer 406a, thereby decreasing the darkcurrent generated in the boundary between the photodiode and the device isolation layer 406a. In addition, the P⁺ type diffusion area 253 recombines the pair of electron and hole generated in the boundary between the device isolation layer 406a and the periphery of the active area for the photodiode PD, thereby decreasing the darkcurrent generated in the boundary.

Although not shown, the impurity ions are diffused in the n⁻ type diffusion area 221, the P° type diffusion area 251, the P⁺ type diffusion area 253, the n⁻ type diffusion area 211, and the n⁺ type diffusion area 261 by performing a thermal process (for example, a rapid thermal process), thereby substantially forming the junction of the respective diffusion areas.

As mentioned above, the CMOS image sensor according to the present invention and the method for fabricating the same have the following advantages.

First, the impurity ions for the photodiode PD are not implanted to the boundary between the photodiode PD and the device isolation layer, so that it is possible to prevent the defect generated by the ion implantation in the boundary between the photodiode PD and the device isolation layer.

Also, the highly doped p-type diffusion area is formed in the boundary between the photodiode PD and the device isolation layer, whereby it is possible to minimize the darkcurrent in the boundary between the photodiode and the device isolation layer, thereby improving the reliability on operation of the CMOS image sensor.

Furthermore, the P° type diffusion area of the photodiode is formed at the predetermined interval from the gate electrode of the transfer transistor by the sidewall insulating layer, thereby minimizing the leakage current of the transfer transistor.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a CMOS image sensor comprising:

forming a device isolation layer in a device isolation area of a first conductive type semiconductor substrate, so as to define an active area having a photodiode and a transistor;

forming a gate insulating layer, a gate electrode, and a sidewall insulating layer in the transistor, and forming a passivation layer on the semiconductor substrate of the boundary between the device isolation layer and the photodiode;

forming a second conductive type diffusion area in the photodiode of the active area; and forming a first conductive type first diffusion area at the boundary between the second conductive type diffusion area and the device isolation layer by tilt-implanting first conductive type impurity ions in an exposed area of the photodiode, using the passivation layer as a mask.

2. The method of claim 1, wherein the first conductive type first diffusion area is formed deeper than the second conductive type diffusion area.

3. The method of claim 1, further comprising the step of forming a first conductive type second diffusion area in the surface of the second conductive type diffusion area of the photodiode.

4. The method of claim 3, wherein the first conductive type first diffusion area has impurity ions of a higher concentration than that of impurity ions of the first conductive type second diffusion area.

5. The method of claim 3, wherein the first conductive type second diffusion area is formed at a predetermined interval from the gate electrode.

6. The method of claim 1, wherein the passivation layer is formed of the same material as the sidewall insulating layer.

7. The method of claim 1, wherein the passivation layer is formed from a deposition structure of the gate insulating layer and the gate electrode of the transistor.

8. A method for fabricating a CMOS image sensor comprising:
 forming a projected device isolation layer having a higher surface than that of a first conductive type semiconductor substrate, in a device isolation area, so as to define an active area having a photodiode and a transistor;
 forming an ion implantation prevention layer at a sidewall of the projected device isolation layer;
 forming a gate insulating layer and a gate electrode in the transistor;
 forming a second conductive type diffusion area in the photodiode of the active area; and
 forming a first conductive type first diffusion area at a boundary between the second conductive type diffusion area and the device isolation layer by tilt-implanting first conductive type impurity ions in an exposed area of the photodiode, using the ion implantation prevention layer as a mask.

9. The method of claim 8, wherein forming the device isolation layer includes the steps of:
 forming an oxidizing insulating layer on the semiconductor substrate;
 selectively removing the oxidizing insulating layer so as to expose the semiconductor substrate of the device isolation area;
 forming a trench by etching the exposed semiconductor substrate;
 depositing an insulating layer to fill the trench, and planarizing the insulating layer to expose the surface of the oxidizing insulating layer; and
 removing the oxidizing insulating layer.

10. The method of claim 9, further comprising the step of forming a thermal oxide layer on an inner surface of the trench after forming the trench.

11. The method of claim 8, wherein the first conductive type first diffusion area is formed by tilt-implanting first conductive type impurity ions.

12. The method of claim 8, wherein the first conductive type first diffusion area is formed deeper than the second conductive type diffusion area.

13. The method of claim 8, further comprising the step of forming a first conductive type second diffusion area in a surface of the second conductive type diffusion area of the photodiode.

14. The method of claim 13, wherein the first conductive type first diffusion area has impurity ions of a higher concentration than that of impurity ions of the first conductive type second diffusion area.

15. The method of claim 8, wherein the ion implantation prevention layer comprises a nitride layer.

* * * * *